US012757730B2

(12) United States Patent
Huang

(10) Patent No.: US 12,757,730 B2
(45) Date of Patent: Oct. 6, 2026

(54) INTEGRATED HYBRID HEAT DISSIPATION SYSTEM THAT MAXIMIZES HEAT TRANSFER FROM HETEROGENEOUS INTEGRATION

(71) Applicant: Shun-Ping Huang, Hsinchu County (TW)

(72) Inventor: Shun-Ping Huang, Hsinchu County (TW)

( * ) Notice: Subject to any disclaimer, the term of this patent is extended or adjusted under 35 U.S.C. 154(b) by 871 days.

(21) Appl. No.: 18/113,393

(22) Filed: Feb. 23, 2023

(65) Prior Publication Data

US 2024/0162107 A1 May 16, 2024

Related U.S. Application Data

(60) Provisional application No. 63/417,326, filed on Oct. 19, 2022.

(51) Int. Cl.

| | |
|---|---|
| ***H01L 23/367*** | (2006.01) |
| ***H01L 23/00*** | (2006.01) |
| ***H01L 23/373*** | (2006.01) |
| ***H01L 25/065*** | (2023.01) |
| ***H10W 40/22*** | (2026.01) |
| ***H10W 40/25*** | (2026.01) |
| ***H10W 42/00*** | (2026.01) |
| ***H10W 90/00*** | (2026.01) |
| *H10W 74/15* | (2026.01) |

(52) U.S. Cl.

CPC ....... *H10W 40/226* (2026.01); *H10W 40/258* (2026.01); *H10W 42/121* (2026.01); *H10W 90/00* (2026.01); *H10W 74/15* (2026.01); *H10W 90/724* (2026.01); *H10W 90/734* (2026.01)

(58) Field of Classification Search

CPC . H10W 40/226; H10W 40/258; H10W 90/00; H10W 90/724; H10W 90/734; H10W 42/121; H10W 74/15

See application file for complete search history.

(56) References Cited

U.S. PATENT DOCUMENTS

| | | | | |
|---|---|---|---|---|
| 4,698,663 A * | 10/1987 | Sugimoto | H01L 23/055 | 174/556 |
| 5,055,914 A * | 10/1991 | Shimizu | H01L 23/04 | 257/722 |
| 7,678,616 B2 * | 3/2010 | Sir | H01L 23/36 | 438/122 |

(Continued)

*Primary Examiner* — Peniel M Gumedzoe

(74) *Attorney, Agent, or Firm* — WPAT, PC

(57) ABSTRACT

A semiconductor package comprises a die mounted on a substrate by flip-chip solder balls; an integrated heat spreader including a thin flexible foil and a supporter; a high temperature durable bonding material applied to the backside of the integrated heat spreader to bond the backside of the integrated heat spreader to the die; a heat sink fixed and attached to the heat sink supporter, wherein the backside of the heat sink is provided with vents and the backside of the heat sink, the integrated heat spreader and the exposed major portion of the die together define a cavity-like container portion; and a thermal interface material applied within the cavity-like container portion, wherein the heat generated from the die is conducted through the thermal interface material to the heat sink, and the vents in the heat sink can accommodate the expansion or shrinkage of the thermal interface material during thermal cycling.

20 Claims, 42 Drawing Sheets

(56) References Cited

U.S. PATENT DOCUMENTS

| | | | | |
|---|---|---|---|---|
| 8,216,887 | B2 * | 7/2012 | Heng | H01L 23/42 438/126 |
| 2013/0188319 | A1 * | 7/2013 | Yamaguchi | H05K 7/2039 361/717 |
| 2015/0279761 | A1 * | 10/2015 | Bet-Shliemoun | H01L 23/04 257/714 |

* cited by examiner

| Micropin Shape | | | |
|---|---|---|---|
| Micropin aspect ratio | 1 | 1.5X | 3X |
| Change in Temperature | 0 | 0.91% | 0.65% |
| Change in Pressure Drop | 0 | 4.7% | -1.2% |

| Type | Thermal conductivity ($Wm^{-1}K^{-1}$) | BLT(pm) | Thermal interface resistance ($Km^2 W^{-1}$) | Pump-out | Absorbs stress | Reusable | Replaceability |
|---|---|---|---|---|---|---|---|
| Thermal grease | 0.4-4 | 20-150 | 10-200 | Yes | Well | No | Medium |
| Thermal pad | 0.8-3 | 200-1000 | 100-300 | No | Well | Yes | Excellent |
| Phase change material | 0.7-1.5 | 20-150 | 30-70 | Yes | Well | No | Medium |
| Thermal gel | 2-5 | 75-250 | 40-80 | No | Medium | No | Medium |
| Thermally conductive adhesive | 1-2 | 50-200 | 15-100 | No | Medium | No | Poor |
| Solder | 20-80 | 25-200 | <5 | No | Poorly | No | Poor |

FIG. 6-1

Additive Thermal Resistance
From Stacked Dies

Thermal Cross-talk between
neighboring Dies
Height Diffence between
Heterogeneous Dies

INTEGRATED HYBRID HEAT DISSIPATION SYSTEM THAT MAXIMIZES HEAT TRANSFER FROM HETEROGENEOUS INTEGRATION

CROSS REFERENCE TO RELATED APPLICATION

This application claims the priority benefit of U.S. Provisional Application Serial Number U.S. 63/417,326, filed on Oct. 19, 2022, the full disclosure of which is incorporated herein by reference.

BACKGROUND

1 Technical Field

The present disclosure relates to a semiconductor package for maximizing the heat dissipation of high-performance computing (HPC) and data center applications, and more particularly to an integrated hybrid heat dissipation system (IHHDS) which can provide the higher efficiency of computing capability and more reliable transient thermal management for ultra-high power density heterogeneous integration in a semiconductor package.

2. Description of the Related Art

Advanced semiconductor technology brings high performance computing but the faster core clock frequency and heterogeneous chips integration in limited dimension also increases higher power densities in computing chips and generates more heat in its package. Therefore, a thermal management system for those silicon chips with high-performance computing (HPC) application becomes the main focus and challenges for the modern processor architecture design. For example. Intel's Xe-HPC GPU, Ponte Vecchio, as shown in FIG. 8-1 is a hybrid heterogeneous integration of multiple high-performance chips and high bandwidth memory (HBM), as shown in FIG. 8-2B, with super high 600 W thermal design power (TDP). There are many new challenges of thermal management in this "hot" silicon chips package, such as:

1) Thermal cross-talks between neighboring silicon components, as shown in FIG. 8-1B;
2) Height differences between heterogeneous components, as shown in FIG. 8-1C;
3) Additive thermal resistance from stacked silicon dies, as shown in FIG. 8-1A and FIGS. 8-2A and 8-2B;
4) Thermal-induced deformations (such as warpage and stress) due to large package dimension and CTE mismatch of heterogeneous integration, as shown in FIGS. 8-1A, 8-1B and 8-1C; and
5) Thermal throttling due to hot spots of individual silicon dies.

Even with applying the water-cooling heat sink, typical thermal management systems (referring to FIG. 5A and FIG. 5B still cannot solve the above bottlenecks and challenges of high-performance computing (HPC) application. According to the description of the typical thermal management system of monolithic (single silicon die) CPU (as shown in FIG. 1) and simplified thermal dissipation model (as shown in FIG. 2), thermal interface material 1 (TIM1) obviously takes more important role and impact than thermal interface material 2 (TIM2) because TIM1 directly contacts the heat source (CPU die) and TIM1 dominates the heat transfer path, efficiency and reliability due to its material features and characteristics. Therefore, the material characteristic (thermal conductivity, k) of TIM1 and the contact area (A) between TIM1 and CPU die are the first pivotal factors to improve the heat transfer of overall thermal management system (referring to FIG. 6-3).

Accordingly, a semiconductor package is required for maximizing the heat dissipation for the high-performance computing (HPC) and data center applications, and providing higher efficiency of computing capability and more reliable transient thermal management for ultra-high power density heterogeneous integration in the semiconductor package.

SUMMARY

An object of the present disclosure is to provide an Integrated Hybrid Heat Dissipation System (IHHDS) that consists of novel materials, novel architecture, and novel manufacturing technology to maximize the heat dissipation of heterogeneous integration package with large package size, ultra-high thermal design power (TDP) and complicated hybrid 2D/3D chaplet packages. Moreover, IHHDS can provide the more reliable and efficient transient thermal management system for high-performance computing (HPC) applications.

According to one aspect of the present disclosure, the semiconductor package comprises a die mounted on a substrate by flip-chip solder balls; an integrated heat spreader including a thin flexible foil and a supporter, wherein the thin flexible foil has a hollowed out central area and a curve-shaped thermal-induced stress absorbing mechanism on its lateral ends and hermetically bonded with the supporter; a high temperature durable bonding material applied to the backside of the integrated heat spreader along the hollowed out central area to bond the backside of the integrated heat spreader to the peripheral edges of the die in such a manner that a major portion of the die is exposed out through the hollowed out central area of the integrated heat spreader; a heat sink fixed and attached to the heat sink supporter, wherein the backside of the heat sink is provided with vents and the backside of the heat sink, the integrated heat spreader and the exposed major portion of the die together define a cavity-like container portion; and a thermal interface material applied within the cavity-like container portion, wherein the heat generated from the die is conducted through the thermal interface material to the heat sink, and the vents in the heat sink can accommodate the expansion or shrinkage of the thermal interface material during thermal cycling.

According to another aspect of the present disclosure, the semiconductor package comprises at least two dies mounted on a substrate by flip-chip solder balls, wherein the two dies have different thickness from each other; an integrated heat spreader including a thin flexible foil and a supporter, wherein the thin flexible foil has at least two hollowed out central areas and a curve-shaped thermal-induced stress absorbing mechanism on its lateral ends and hermetically bonded with the supporter; a high temperature durable bonding material applied to the backside of the integrated heat spreader along the hollowed out central areas to bond the backside of the integrated heat spreader to the peripheral edges of the dies in such a manner that a major portion of each die is exposed out through the hollowed out central areas of the integrated heat spreader; a heat sink fixed and attached to the heat sink supporter, wherein the backside of the heat sink is provided with vents and the backside of the heat sink, the integrated heat spreader and the exposed major portion of the dies together define a cavity-like container portion; and a thermal interface material applied within the cavity-like container portion, wherein the heat generated from the die is conducted through the thermal interface material to the heat sink, and the vents in the heat sink can accommodate the expansion or shrinkage of the thermal interface material during thermal cycling.

According to another aspect of the present disclosure, the heat sink includes a microjet impingement mechanism having an inlet chamber, a plurality of inlet vents and jet nozzles, an outlet queue chamber, a plurality of restored nozzles outlet vents; wherein cold liquid is filled into the inlet chamber through the inlet vents and direct-jetted on to the surface of die through the jet nozzles, and heated liquid is also filled into the outlet queue chamber through the restored nozzles and then pumped out through the outlet vents.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5-1A is a schematic diagram illustrating the prior art from US 20200194817 A1 and FIG. 5-1B is a schematic diagram illustrating the prior art from US 20210305227 A1.

FIG. 5-2A is a schematic diagram illustrating the prior arts from U.S. Pat. No. 9,646,910 B2 and FIG. 5-2B is the graphs/chart from the article "Advanced System Integration for High Performance Computing with Liquid Coolin".

FIG. 6-1 is a schematic diagram illustrating the table for common types of commercial thermal interface materials (TIMs) and typical properties.

FIG. 6-2A, FIG. 6-2B and FIG. 6-2C are schematic diagrams illustrating the examples of metal matrix composite (MMC).

FIG. 6-3 is a schematic diagram illustrating the Fourier's Formula for Thermal Conduction.

FIG. 6-4A and FIG. 6-4B are schematic diagrams illustrating prior art from graphs of article "Backside Metallization for Low Cost High Thermal Package"

FIG. 7-1 is a schematic diagram illustrating the cross-section view of IHHDS for monolithic silicon die according to an embodiment of the present disclosure.

FIG. 7-1-1 is a schematic diagram illustrating the top view A-A' of FIG. 7-1, the cross-section view of IHHDS for monolithic silicon die.

FIG. 7-1-2 is a schematic diagram illustrating the cross-section view of IHHDS for monolithic silicon die with protruded part of het sink.

FIG. 7-2 is a schematic diagram illustrating the cross-section view of IHHDS for monolithic silicon die with phase change material and uniform distributed fin array embedded heat sink.

FIG. 7-2-1 is a schematic diagram illustrating the cross-section view of IHHDS for monolithic silicon die with phase change material and fin array (hotspots-oriented) embedded heat sink.

FIG. 7-3 is a schematic diagram illustrating the cross-section view of IHHDS for monolithic silicon die with microjet impingement liquid cooling heat sink.

FIG. 7-3-1 is a schematic diagram illustrating the top view A-A' of FIG. 7-3, the cross-section view of IHHDS for monolithic silicon die with microjet impingement liquid cooling heat sink.

FIG. 7-3-2A, FIG. 7-3-2B and FIG. 7-3-2C are schematic diagrams illustrating the graphs of package with microjet hotspot-targeted cooling syste.

FIG. 7-4 is a schematic diagram illustrating that the phase change material can absorb instantly the conductive heat from the silicon die during its phase-change period from the solid state toward the liquid state as reach its melting temperature.

FIG. 7-5 is a schematic diagram illustrating that the more (thicker) the phase change material (PCM) is used, the more heat can be absorbed.

FIG. 7-6A, FIG. 7-6B, FIG. 7-7A, FIG. 7-7B, FIG. 7-7C, and FIG. 7-8 are schematic diagrams illustrating the graphs for thermal management systems selecting appropriate thermal resistance (R) and thermal capacitance (C) values FIG. 8-1A, FIG. 8-1B and FIG. 8-1C are schematic diagrams illustrating the challenges of INTEL prior art.

FIG. 8-2A, and FIG. 8-2B are schematic diagrams illustrating the detailed packaging graph of silicon components of INTEL prior art.

FIG. 9-1 is a schematic diagram illustrating the cross-section view of IHHDS for chiplet heterogeneous integration.

FIG. 9-1-1 is a schematic diagram illustrating the top view A-A' of FIG. 9-1, the cross-section view of IHHDS for chiplet heterogeneous integration.

FIG. 9-1-2 is a schematic diagram illustrating the cross-section view of IHHDS for chiplet heterogeneous integration with isolated grid bars on thin flexible IHS foil.

FIG. 9-1-3 is a schematic diagram illustrating the cross-section view of IHHDS for chiplet heterogeneous integration with different protruded parts of het sink.

FIG. 9-2 is a schematic diagram illustrating the cross-section view of IHHDS for chiplet heterogeneous integration with phase change material and uniform distributed fin array embedded heat sink.

FIG. 9-2-1 is a schematic diagram illustrating the cross-section view of IHHDS for chiplet heterogeneous integration with phase change material and fin array (hotspots-oriented) embedded heat sink.

FIG. 9-3 is a schematic diagram illustrating the cross-section view of IHHDS for chiplet heterogeneous integration with microjet impingement liquid cooling heat sink.

FIG. 9-3-1 is a schematic diagram illustrating the top view A-A' of FIG. 9-3, cross-section view of IHHDS for chiplet heterogeneous integration with microjet impingement liquid cooling heat sink.

FIG. 10-1, FIG. 10-2, FIG. 10-3, and FIG. 10-4 are schematic diagrams illustrating the assembly process of thin flexible IHS foil attachment toward monolithic silicon chip package.

FIG. 11-1, FIG. 11-2, FIG. 11-3, and FIG. 11-4 are schematic diagrams illustrating the assembly process of thin flexible IHS foil attachment toward heterogeneous integration silicon chips package.

DETAILED DESCRIPTION OF THE PREFERRED EMBODIMENT

Figure 1:
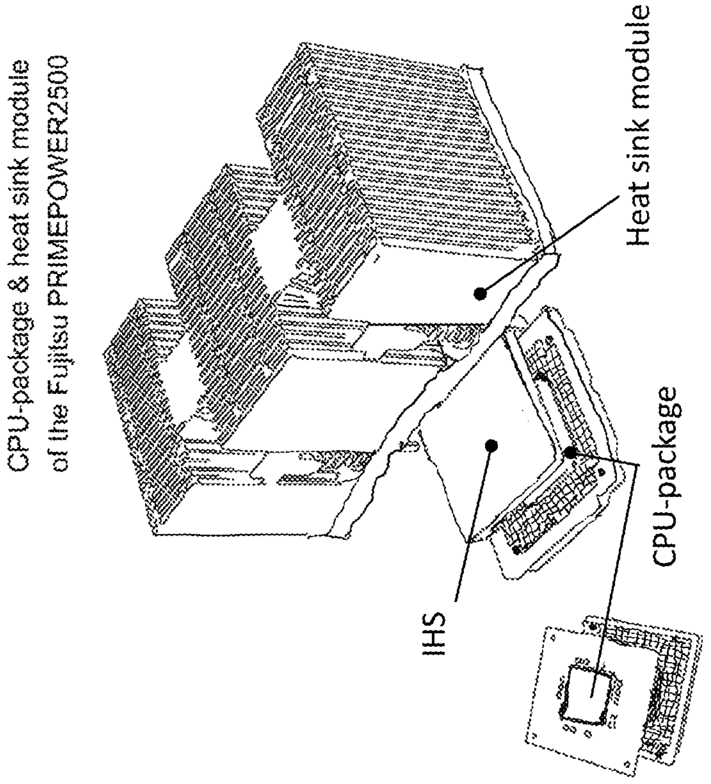
FIG. 1 (PRIOR ART)
FIG. 1 illustrates the cross-section view of typical monolithic CPU package and the expanded view graph of CPU-package and heat sink module of the Fujitsu prior art.
Figure 1:
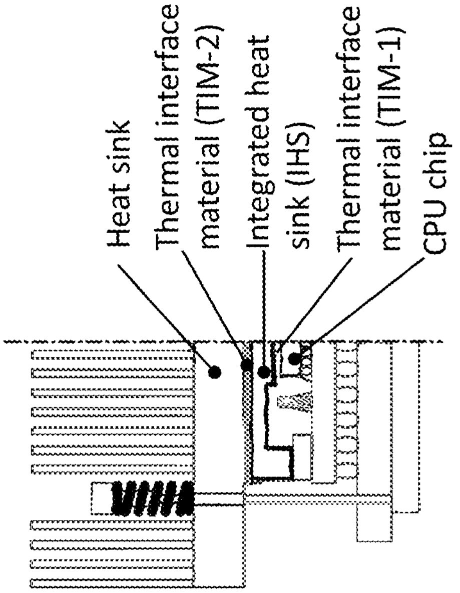
FIG. 1 (PRIOR ART)

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatial relative terms, such as "beneath." "below," "lower," "above," "upper" and the like, may be used herein for ease of description to describe one element or feature's relationship to another element(s) or feature(s) as illustrated in the figures. The spatial relative terms are intended to encompass different orientations of the device in use or operation in addition to the orientation depicted in the figures. The apparatus may be otherwise oriented (rotated 90 degrees or at other orientations) and the spatial relative descriptors used herein may likewise be interpreted accordingly.

Figure 3A:
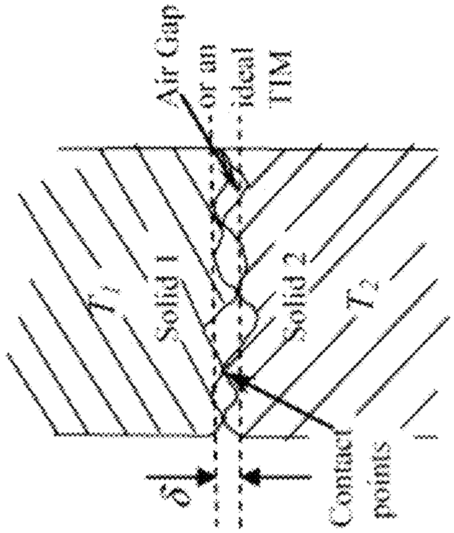
FIG. 3A illustrates schematic showing that real area of contact is less than apparent area of contact. This figure also shows an ideal TIM, which completely fills the gap with zero thickness.
Figure 3B:
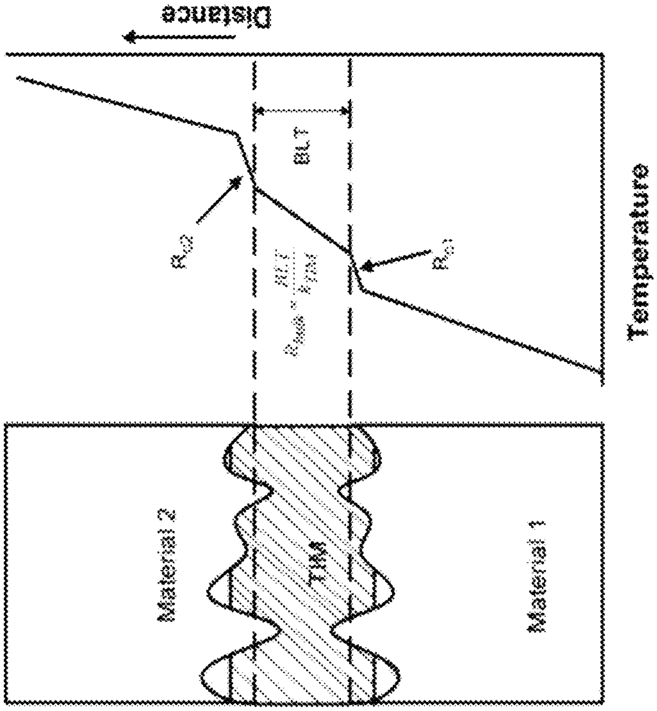
FIG. 3B illustrates schematic showing a real TIM.

As shown in FIG. 3A and FIG. 3B, the thermal resistance $R_{th}$ between Material 1 and Material 2 is the sum of $R_{c1}$, $R_{bulk}$, and $R_{c2}$, where $R_{c1}$ is the interface contact resistance between Material 1 and TIM, $R_{c2}$ is the interface contact resistance between Material 2 and TIM, and $R_{bulk}$ is the thermal resistance of bulk TIM ($R_{bulk}$=BLT/$K_{TIM}$, BLT is bonding line thickness and $K_{TIM}$ is thermal conductivity of bulk TIM). Normally, thermal conductivity of metal is much higher than polymer (referring to FIG. 6-1). Therefore, the bulk thermal conductivity of metal-TIM is higher than film-TIM and gel-TIM. Even though polymer or epoxy has better modulus and viscosity for mating with rough surface (FIG. 3 (*b*)) of heat spreader (Material 2) and backside metal of silicon die (Material 1), but film-TIM or gel-TIM cannot compete with metal-TIM because of their lower thermal conductivity. Moreover, the interface contact resistance ($R_{c1}$ and $R_{c2}$) between thermal interface material (TIM) and mating surfaces of Material 1 and Material 2 depends on the bonding quality between mating interfaces, such as good wettability, no void and gaps in between. Thermal resistance of TIM ($R_{th}$) is included in overall thermal resistance of package ($\Theta_{JC}$) and varied as temperature changes. The main reasons are the thermal-induced stress and warpage between mating surfaces originated from the CTE (Coefficient of Thermal Expansion) mismatch between different materials during thermal cycling (referring to FIG. 4A and FIG. 4B). Thermal resistance of TIM2 is also under the same situation as TIM1 but not near to silicon die. The above thermal-induced deformations not only effect the thermal resistance of TIMs but also impact their bonding interface reliability and quality between different mating materials.

Figure 5:
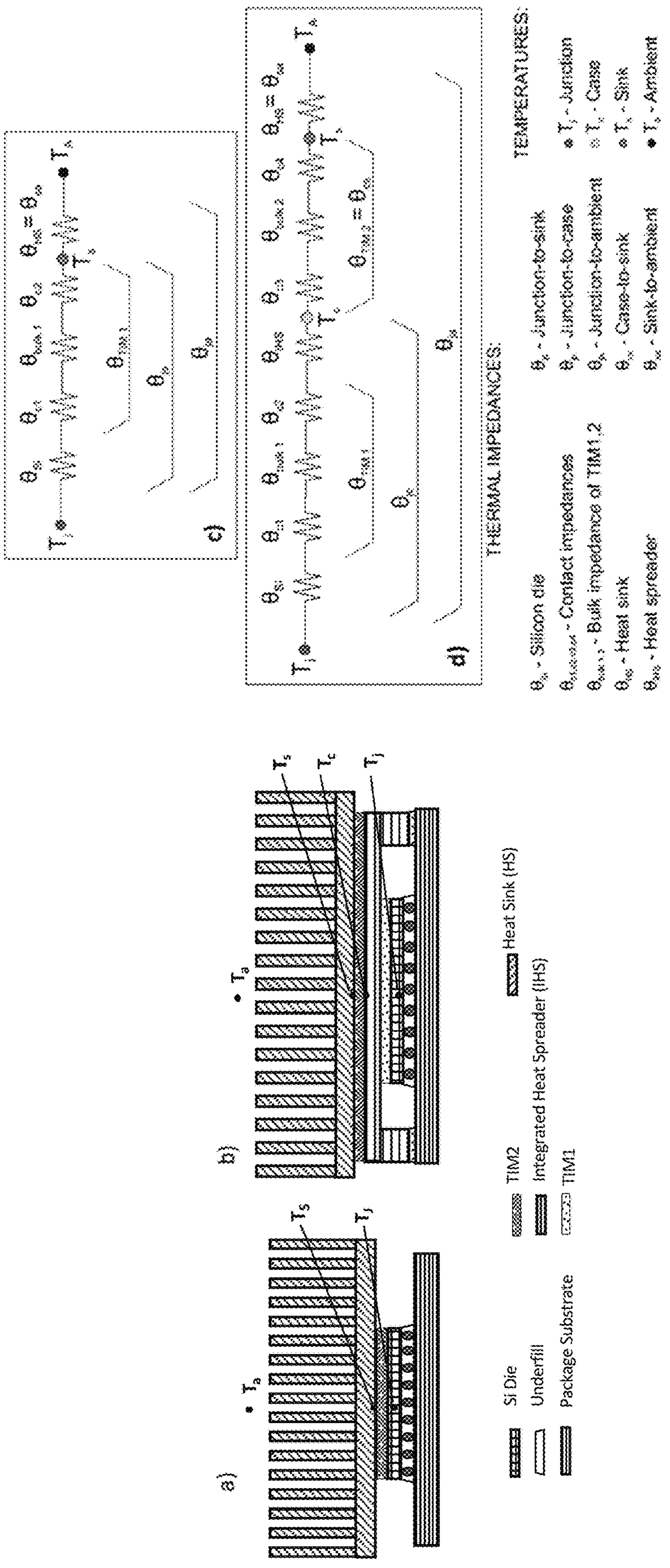
(PRIOR ART) FIG. 5
FIG. 5 illustrates the simple resistance model of heat dissipation system of typical monolithic silicon package for lidless and lidded types.
Figures 1, 5:
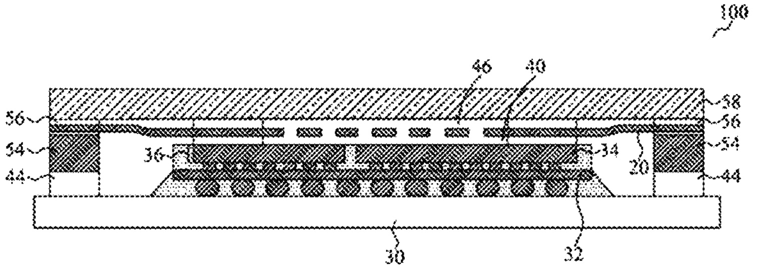
FIG.5-1 A (PRIOR ART)
Figures 1B, 5:
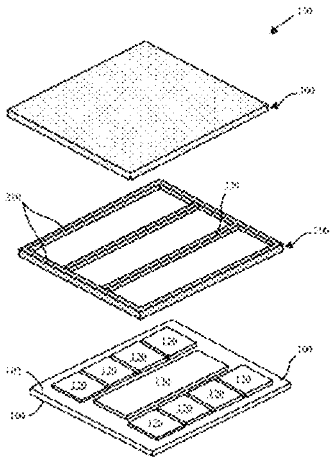
FIG.5-1B (PRIOR ART)
Figures 2, 5:
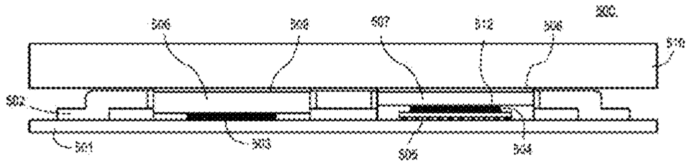
FIG.5-2 A (PRIOR ART)
Figures 2, 5:
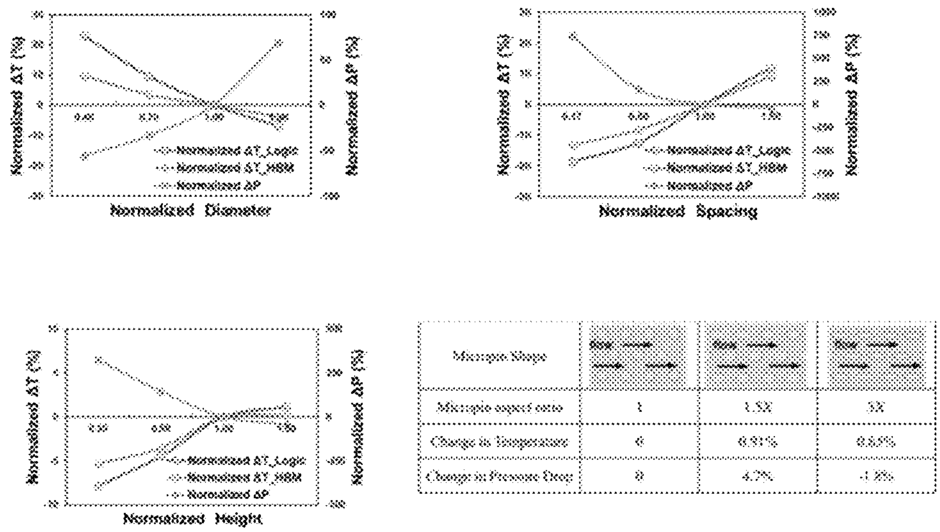
FIG.5-2 B (PRIOR ART)

As shown in FIG. 5-1A and FIG. 5-14B, there are two package structures for typical passive heat dissipation system: Lidless (FIG. 5-1A) and Lidded (FIG. 5-1B). Apparently, Lidless package has better thermal resistance than the Lidded one because of less material and thickness in overall package. However, Lidless package also shows the potential tilt of TIM2 and the unreliable support structure of heat sink. The above both passive heat dissipation systems cannot meet the requirement of heterogeneous integration for multiple chips package. Meanwhile, as the overall chips' area increase and super high power dissipation flow request, the thermal-induced deformations are getting worse. In other words, TIMs play more important part in the overall thermal management and TIM's bulk material characteristic is also the bottlenecks of heat dissipation performance In addition, interface contact resistance and bonding/mating quality between TIMs and mating substrates are essential to the reliability of whole heat dissipation system. Therefore, the novel heat dissipation solution with brand new architecture and materials is necessary for the thermal management of emerging heterogeneous integration.

Figures 1, 7:
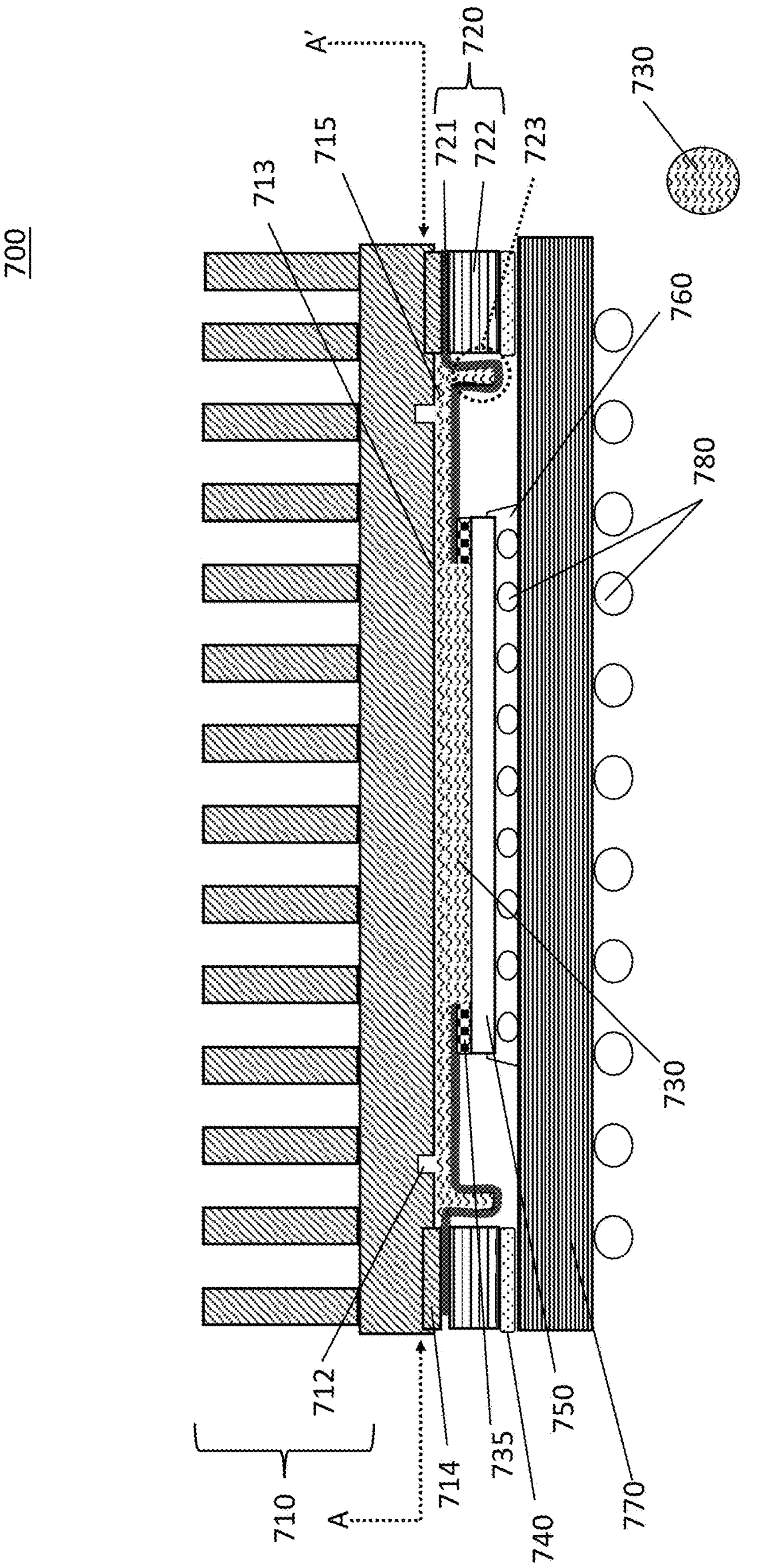
Figures 1, 7:
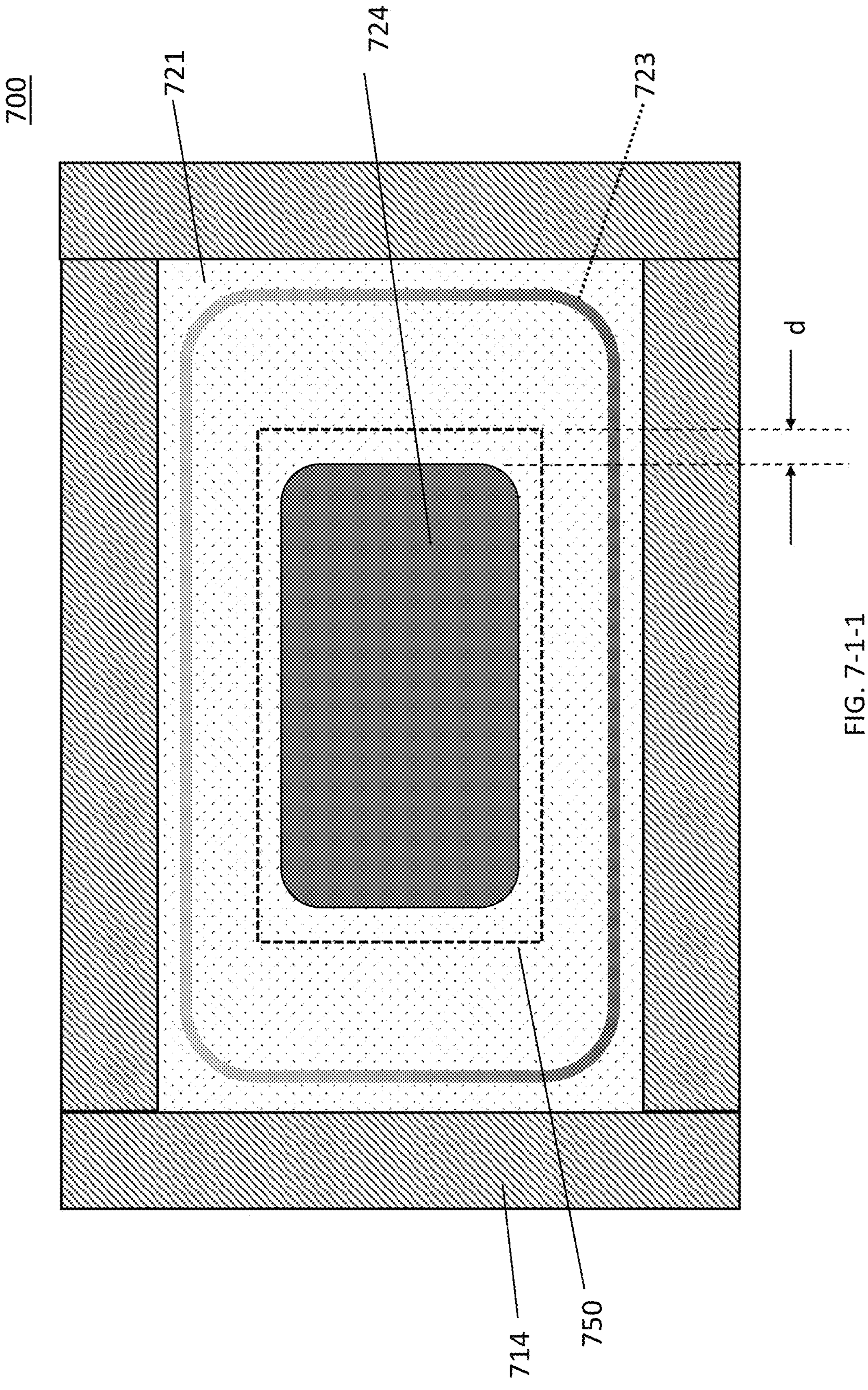
Figures 1, 2, 7:
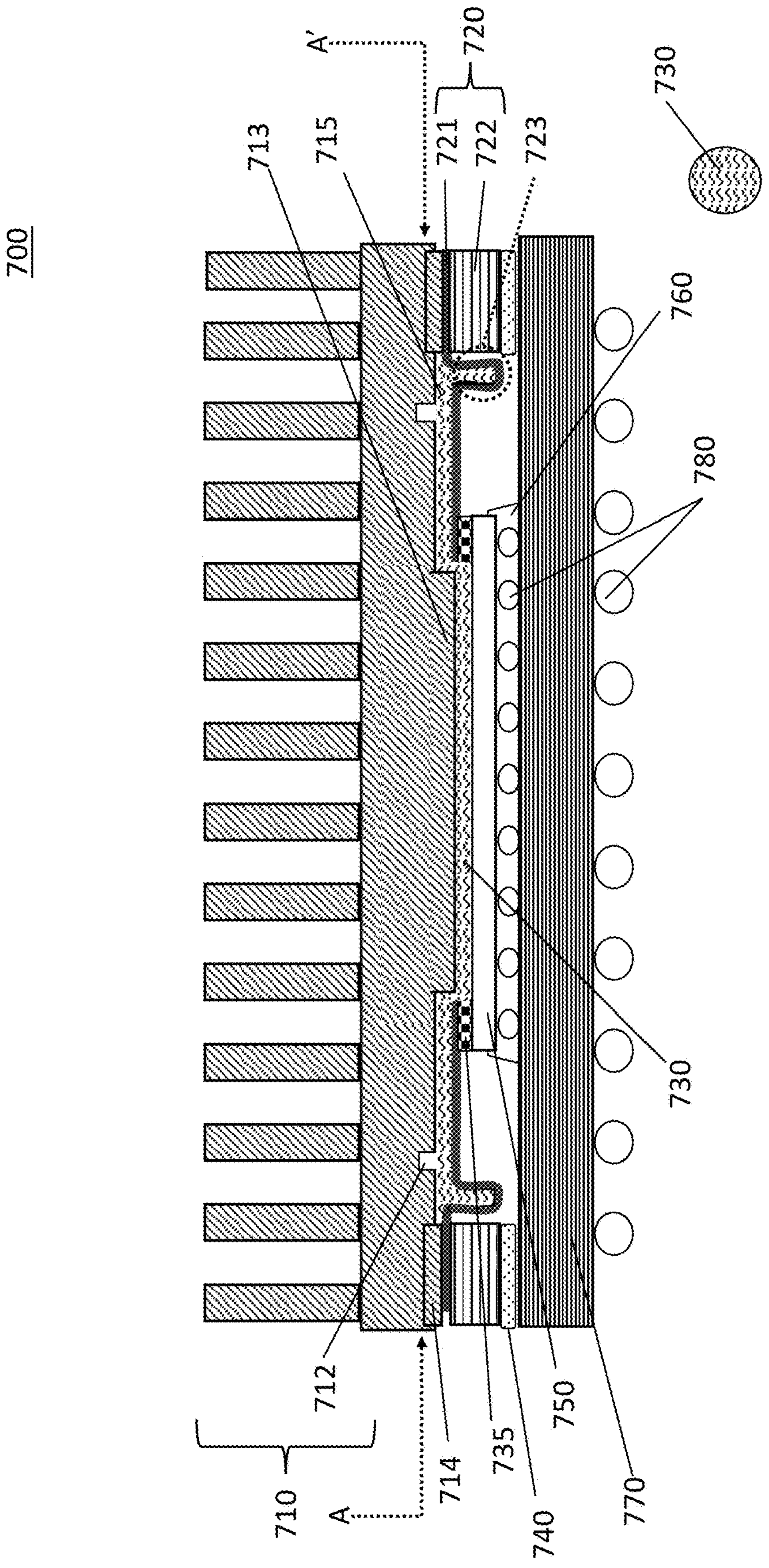
Figures 2, 7:
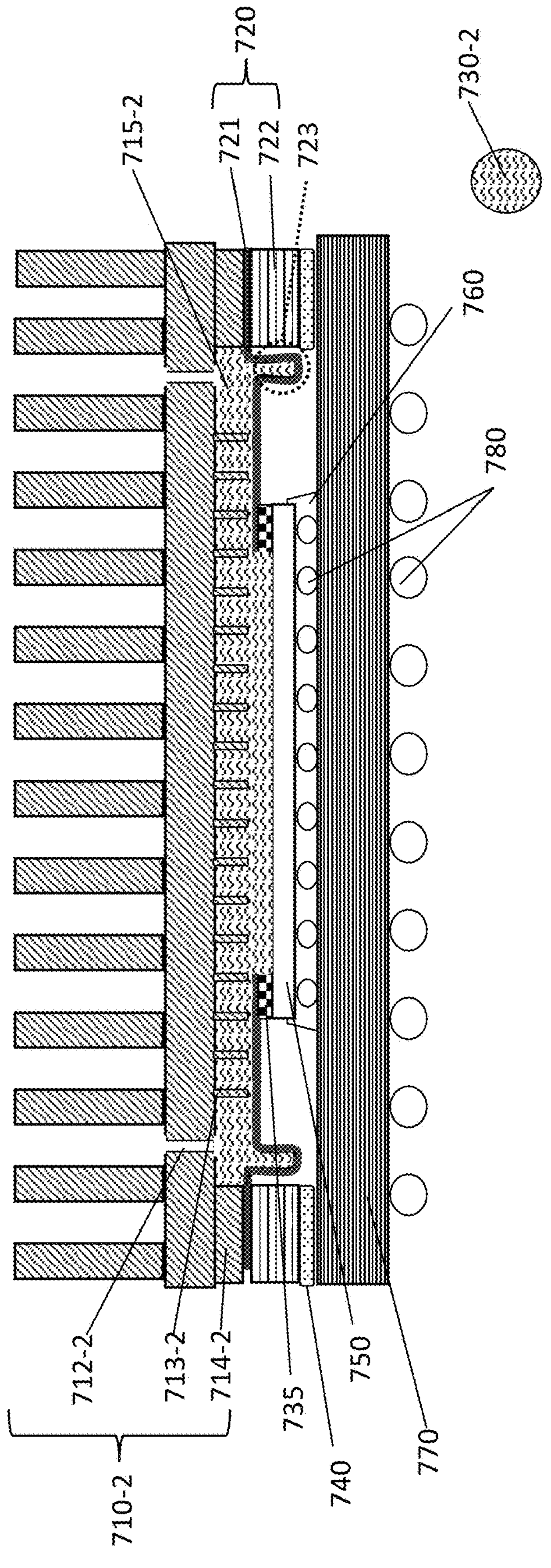
Figures 1, 2, 7:
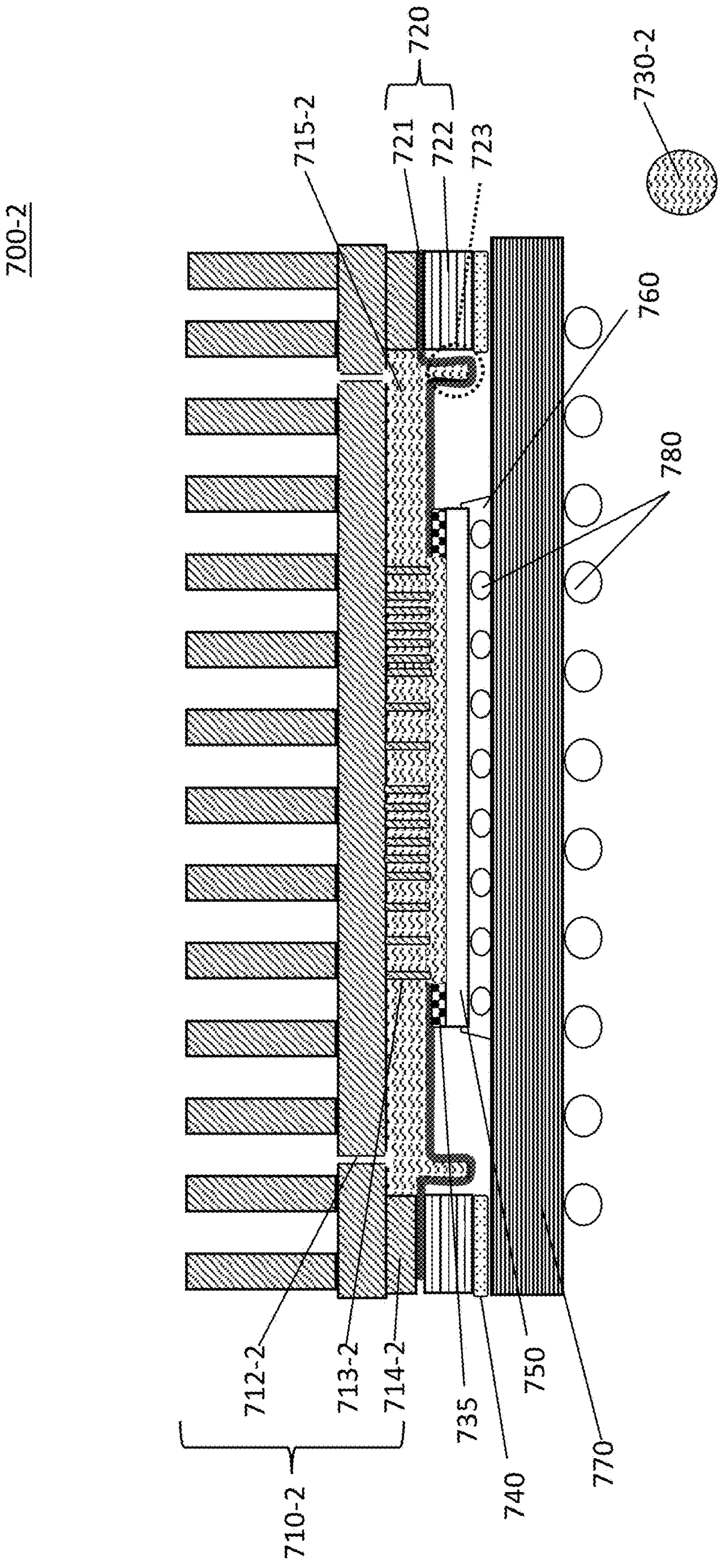
Figures 3, 7:
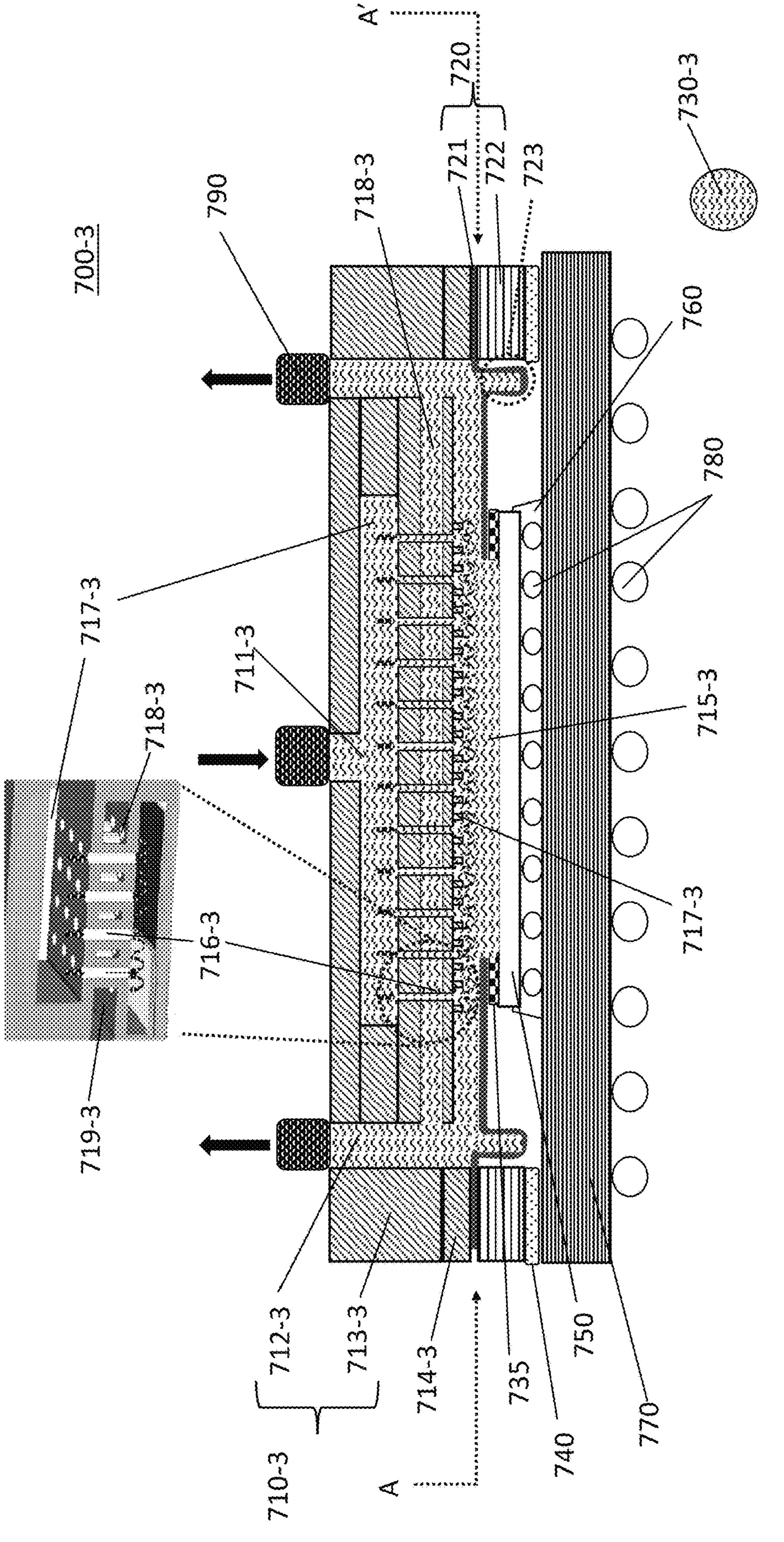
Figures 1, 3, 7:
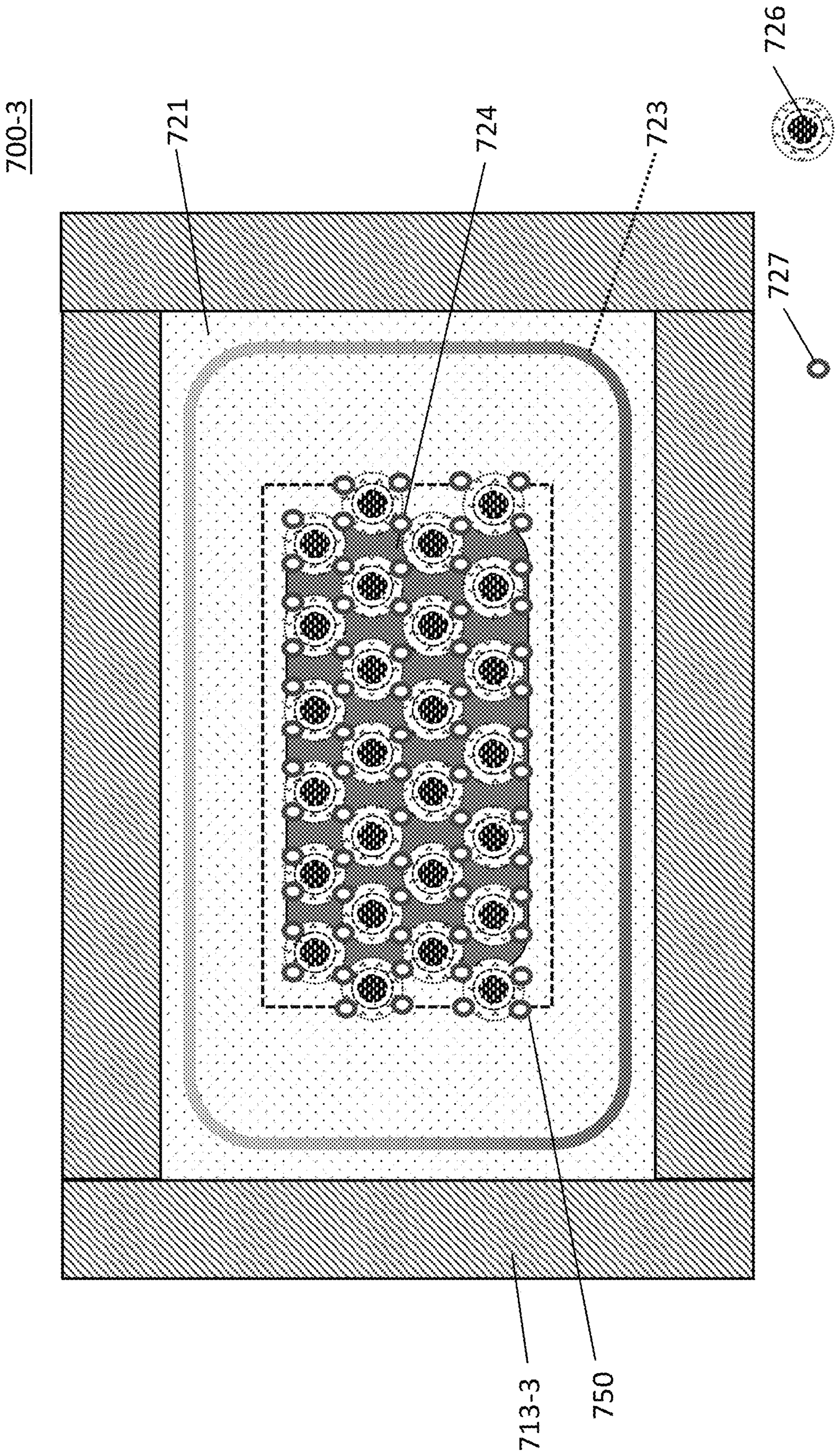
Figures 2, 3, 7:
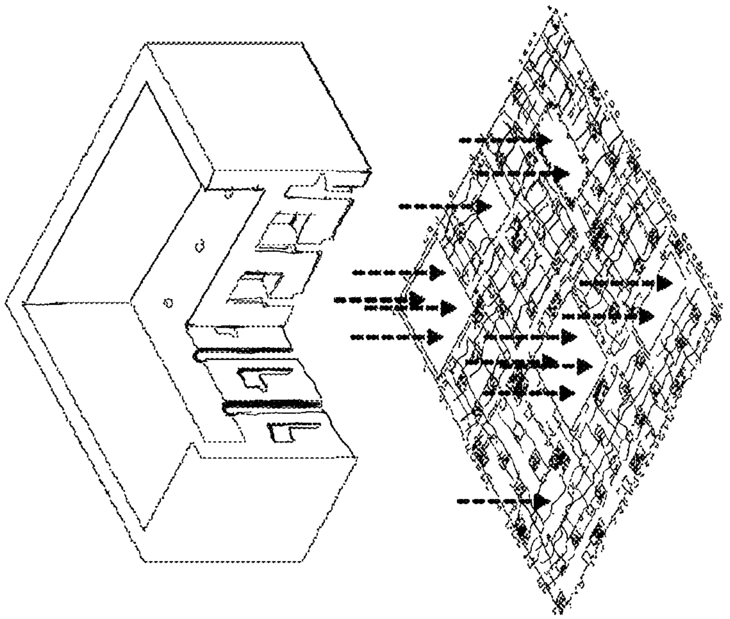
Figures 2, 3, 7:
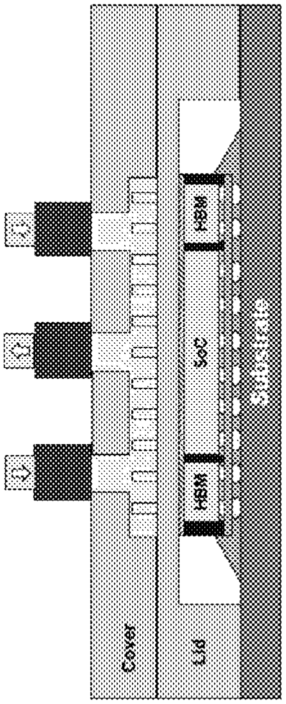
Figures 2, 3, 7:
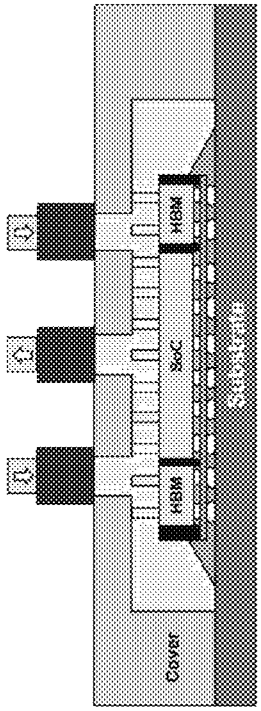
Figures 4, 7:
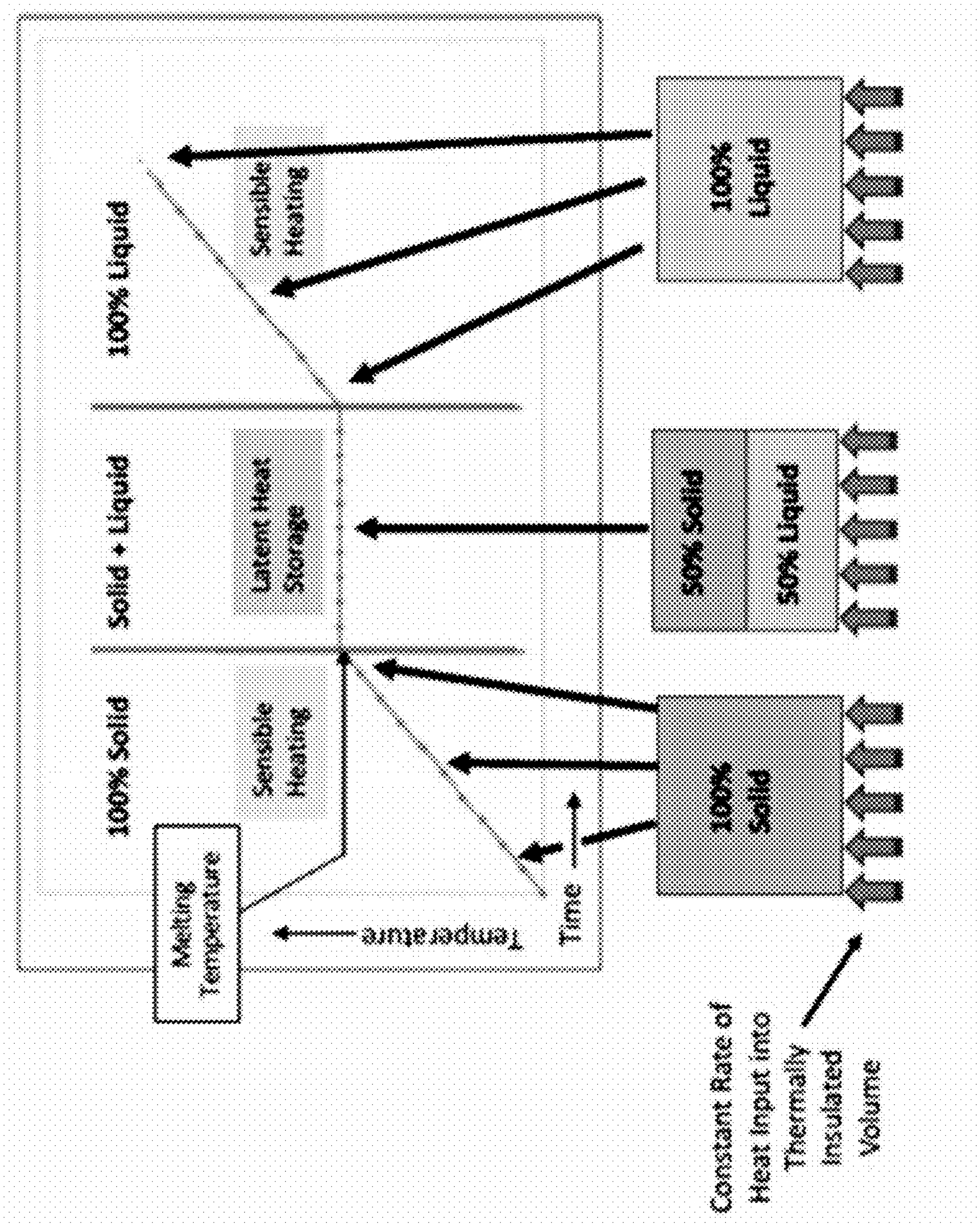
Figures 5, 7:
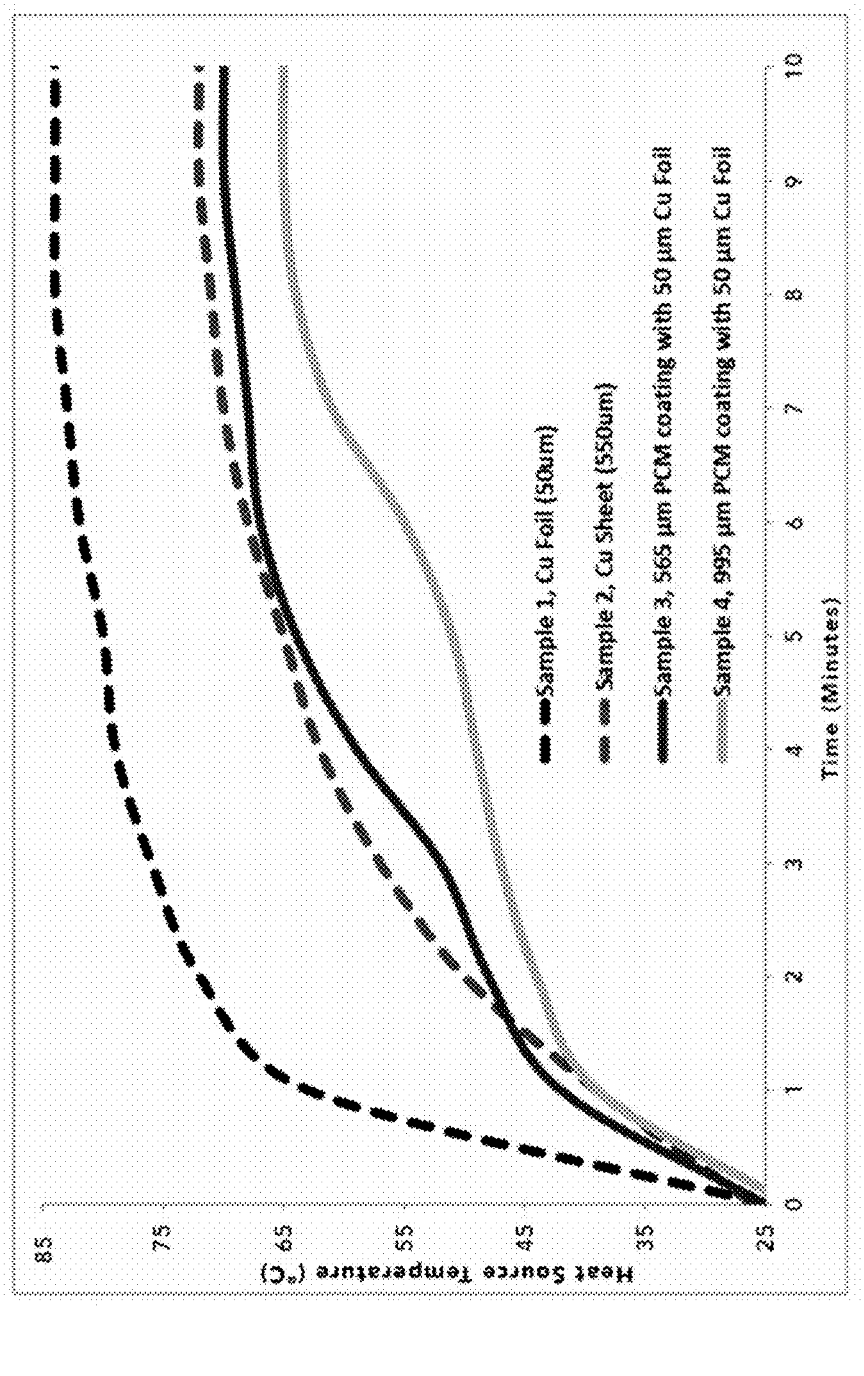
Figures 6, 7:
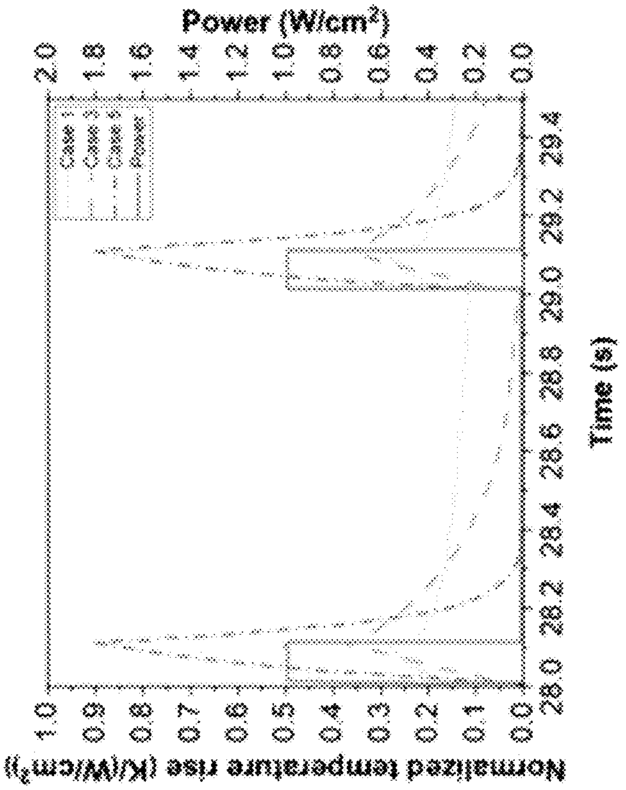
Figures 6, 7:
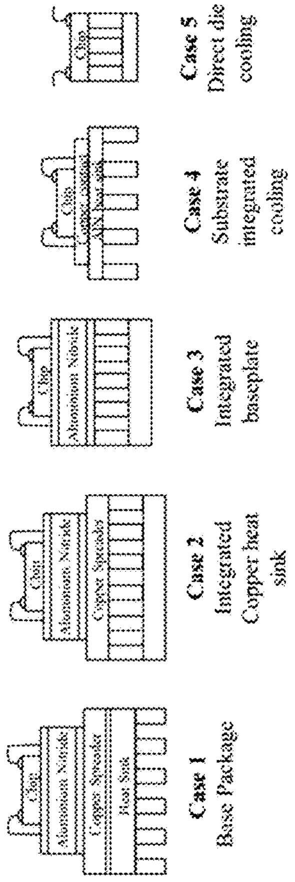
Figure 7:
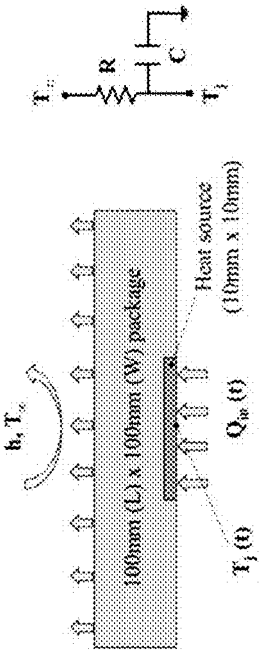
Figure 7:
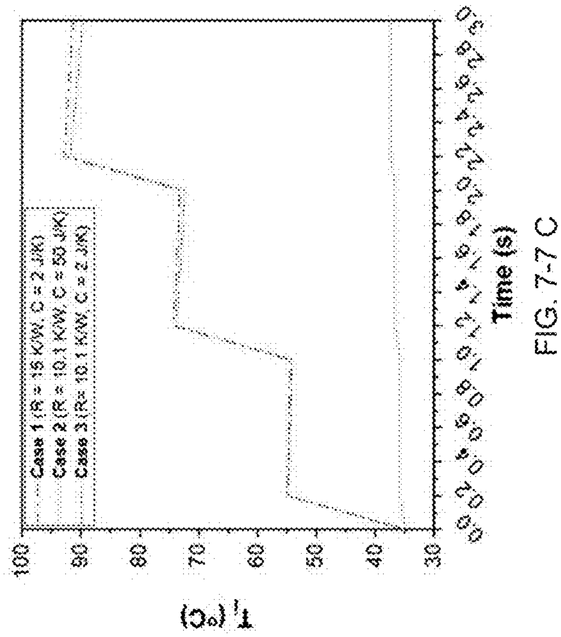
Figure 7:
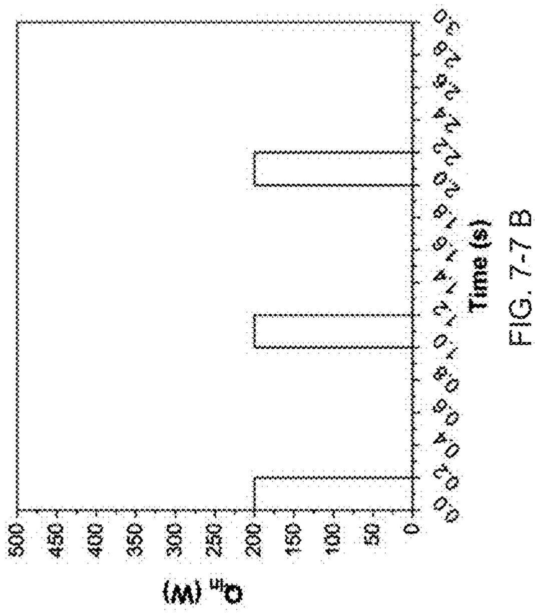

As FIG. 5-1A shown, US 2020/0294817 A1 disclosed the perforated foil sheet (PFS) including through-openings and thermal interface material (TIM) filled over perforated foil sheet (PFS). The TIM/PFS/TIM sandwiched structure provides direct heat path between silicon chip (hotspots) toward heat dissipation lid directly through the openings of perforated foil sheet (PFS). Moreover, US 2020/0294817 A1 also disclosed the stress absorber mechanism in the perforated foil sheet (PFS) to avoid the thermal induced stress cause by CTE mismatch during thermal cycling. As FIG. 5-2A exhibited, it is disclosed that an individual heat spreader with different thickness mates with individual mated silicon chip with different thickness and those heat spreaders are put into the openings of stiffener plate in order to maximize heat transfer from silicon chips to heat sink. As silicon chip size and power density increasing, the higher junction temperature, the more serious thermal induced deformation (warpage and stress). Therefore, larger silicon area should be exposed and thermal interface material should directly contact the backside of silicon chip. Accordingly, die-exposed thin flexible integrated heat spreader metal foil should bond to backside metallization of silicon chip directly (FIG. 7-1).

Figures 2, 6:
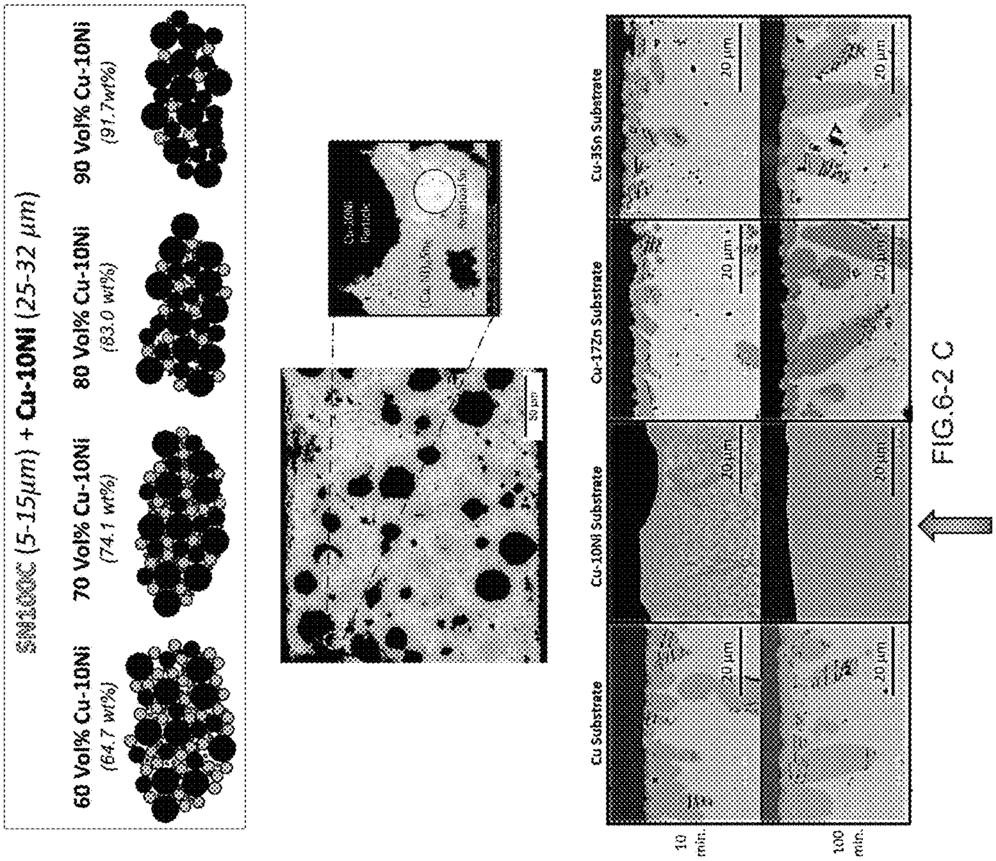
Figures 2, 6:
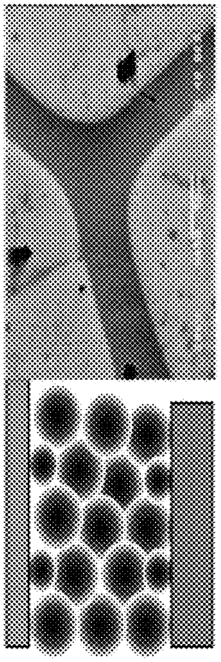
Figures 2, 6:
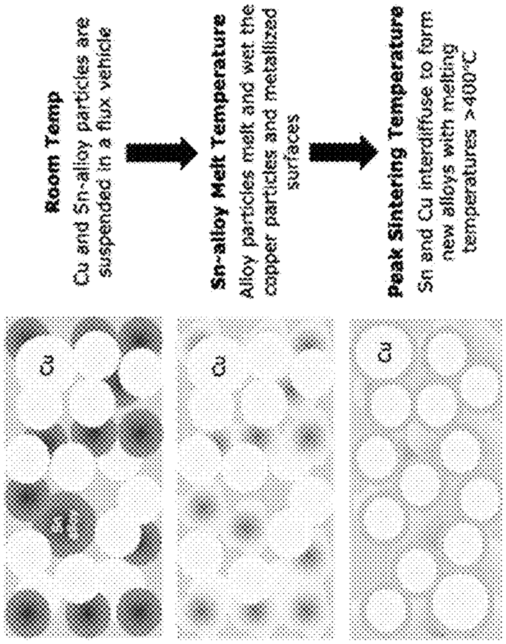

As FIG. 6-1 table shown, solder has potential to provide better thermal conductivity and thermal interface resistance but its poor modulus cannot endure the thermal-induced deformations, such as warpage and thermal stress. Moreover, interfacial intermetallic compound (IMC) generated by the inter-diffusion between solder and mating metal substrates is the most reliability concern during thermal cycling and power cycling. Metal matrix composites (MMC) technology of Powder Metallurgy (PM) shows high potential to have better thermal characteristics, such as SLH (Solid/Liquid Hybrid) Metal TIM of Indium company (FIG. 6-2A), TLPS (transient liquid phase sintering) paste of Merck company (FIG. 6-2B), and high temperature lead-free Cu—Ni/Sn composite solder paste that mentioned by Dr. I. E. Anderson (FIG. 6-2C). Micrometer-scaled high melting point metal (HMPM) particles are mixed with micro/nanometer-scaled low melting point metal (LMPM) particles in specific ratio and infiltrated with fillers to have good viscosity to handle, such as paste or preform.

According to one embodiment of the present disclosure, the composite solder joints are produced with a variety of blends of gas-atomized Cu-10Ni wt. % powder and Sn−0.7Cu−0.05Ni+0.01Ge wt. % Nihon-Superior SN100C solder powder. The Cu-10Ni powders are of the size range 25-32 μm and the SN100C powders are of the size range 5-15 μm. The powder size of the Cu—Ni is chosen to be larger than the SN100C, so as to maximize surface area for wetting and minimize IMC formation. After analysis, the best ratio of powders is determined to be about 70 volume percent Cu-10Ni with 30 volume percent SN100C. This combination resulted in the best continuous Cu—Ni conductive network while not sacrificing the tin alloy matrix needed to wet the particles together to form our important IMC.

Due to the above specific particle diameter and ratio mixing technology, it will shorten the interaction period (about 1 minute) than typical soldering (typical reflow process time is about 6 minutes). Quick thermal compression bonding or other solid-state bonding such as thermosonic bonding can perform this shorter and quicker heating process and avoid the damage of silicon dies cause longer heating process. After this shorter and quicker heating, the mixed particles will perform inter-diffusion in between high melting point metal (HMPM) particles and low melting point metal (LMPM) particles, and then form hybrid metal composite with Cu—Sn—Ni intermetallic compound (IMC) networks (shown as middle part of FIG. 6-2C). Appropriate particle's diameter (Cu-10Ni powders of the size range 25-32 μm and the SN100C powders of the size range 5-15 μm) and mixing ratio between high melting point metal (HMPM) particles and low melting point metal (LMPM) particles (about 70 volume percent Cu-10Ni with 30 volume percent SN100C) not only provides the capability to absorb the thermal-induced stress but also forms higher thermal conductivity than typical leadfree solder. Moreover, the higher melting point of remaining un-melting Cu-10Ni (melting point:1100° C.) particles and $(Cu, Ni)_6Sn_5$ (melting point: 415° C.) formed intermetallic compound (IMC) networks (i.e. 3d skeleton), metal matrix composite (MMC) after heating process shows higher re-melting point (i.e. application temperature) to affordable the following mass-reflow assembly processes. Moreover, MMC also have much better and reliable contact interface with heat sink and backside metallization of silicon die than typical leadfree solder (shown as the arrow-pointed of FIG. 6-2C). The high temperature durable bonding material is composed of metal matrix composite (MMC) with quick/short process period less than about 5 minutes, higher re-melting point more than 300° C., higher thermal conductivity and better contact interface with mating surfaces Meanwhile, the area (A) of interface contact is proportional to the rate of heat flow (Q) according to Fourier's formula of heat conduction (law of heat conduction, FIG. 6-3). Even though the overall thermal resistance of lidless package is much better than lidded package but the whole heat flux of lidless package system is limited as much smaller interface contact area (A) of silicon die.

Figure 4A:
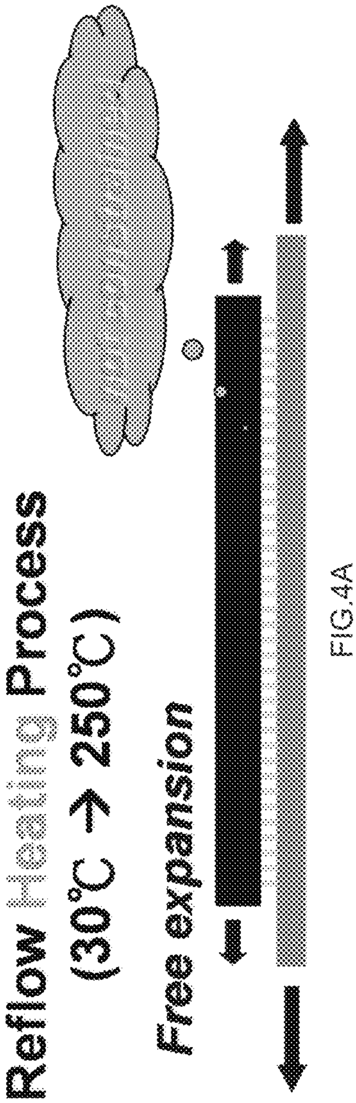
FIG. 4A illustrates no constraint between DIMM socket and PCB during the reflow heating process.
Figure 4B:
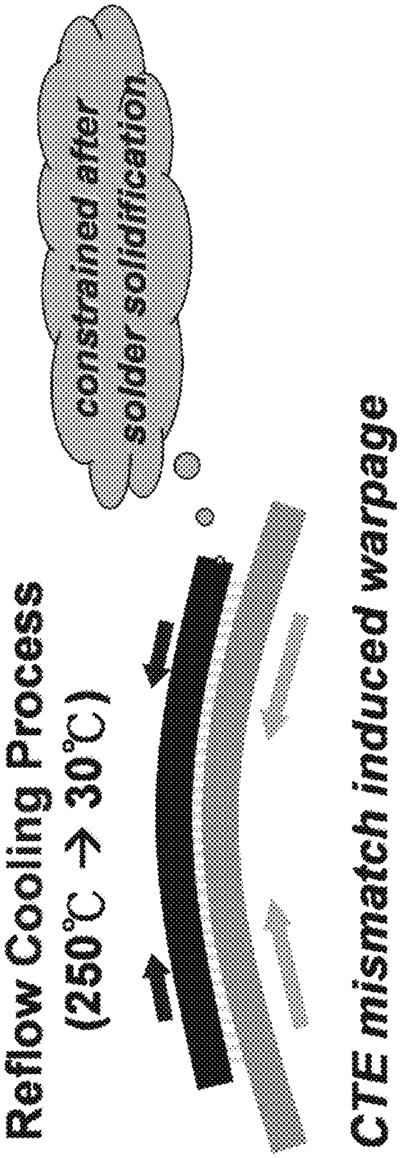
FIG. 4B illustrates thermally-induced warpage of the PCB assembly due to a coefficient of thermal expansion (CTE) mismatch during the reflow cooling process.

As FIG. 6-4A and FIG. 6-4B exhibited, die-exposed molded fcCSP with backside metallization package (arrow-pointed in FIG. 6-4A and FIG. 6-4B) shows much better overall thermal resistance than typical Lidless and Lidded heat dissipation system (as shown in FIG. 5A and FIG. 5B) because the larger and very thin backside metallization layer replaces the typical integrated heat spreader and the sputtered thin metal layer is directly attached on the silicon die. In other words, TIM1 of typical Lidded heat dissipation system (FIG. 5B) is perished completely in order to reach the better overall thermal resistance of the dissipation system. Meanwhile, the backside metal layer on the top of chip and mold not only shows much flexible than typical metal integrated heat spreader to absorb the stress from thermal-induced deformation during the thermal cycling period but also has same heat spreader area as Lidded dissipation system (FIG. 5B). As FIG. 6-4B shown, it is also pointed out that thermal dissipation performance of two packages is almost same and thus high-cost LID is not necessary for die-exposed molded fcCSP with backside metallization package. Unfortunately, there is necessary to develop the novel BSM layer that can afford to large monolithic silicon die and also large dimension of chiplets' heterogeneous integration.

In a new passive heat dissipation package (700) shown in FIG. 7-1, a large silicon die (750) mounted on a PCB substrate (770) by flip-chip solder balls (780) and infiltrated with underfill (760) between the gap of silicon die (750) and PCB substrate (770). An integrated heat spreader (IHS, 720) with die-exposed mechanism as shown in FIG. 6-4A and FIG. 6-4B which comprises a flexible die-exposed IHS foil (721) and an IHS foil supporter (722) is sealed with the PCB substrate (770) with a sealant (740). The thin flexible IHS foil (721) has curve-shaped thermal-induced stress absorbing mechanism (723) on lateral ends (the top view of A-A' of FIG. 7-1) and is hermetically bonded on the edges of silicon die (750) with high temperature durable bonding material (735) which composed of metal matrix composite (MMC) (mentioned as above). A heat sink supporter (714) is hermetically bonded on integrated heat spreader (IHS, 720) and then a cavity-like container (715) is formed by the heat sink supporter (714), exposed silicon die, and integrated heat spreader (IHS, 720), wherein the height of heat sink support (714) is higher than thickness of thermal interface material (730). A thermal interface material (TIM1.5, 730) is applied into the container (715) and covered on the top of thin flexible IHS foil (721) and die-exposed area in the container (715) completely, where the thermal interface material TIM1.5 (730) is different with typical TIM1 and TIM2 (shown in FIG. 5) because it is applied among the exposed silicon die, the IHS foil (721), and the heat sink (710). Then the heat sink (710) with empty vents (712) and protruded part (713) is attached to the top of the heat sink supporter (714) by a sealant or other mechanical attachments (such as screws, not shown) and contacted with the surface level of thermal interface material (TIM1.5, 730) as close as possible to keep good contact interface for better thermal conduction. The empty vents (712) can be tolerated the volume change of the thermal interface material (TIM1.5, 730) during thermal cycling. The thin flexible die-exposed IHS foil (721) is composed of high thermal conductivity material such as copper foil or other metal coated composite foil which made of graphite, graphene or carbon nanotube (CNT) inside. Therefore, the IHS foil (721) not only has good adhesion with thermal interface material (TIM1.5, 730) and high temperature durable bonding material (735) which composed of metal matrix composite (MMC), but also forms the good interface contact resistance between the thermal interface material (TIM1.5, 730) and high temperature durable bonding material (735). Meanwhile, the temperature of this quick bonding process (such as quick TCB or other solid-state thermosonic bonding) is relatively lower than the typical solder and the shorter bonding period can avoid the damage of silicon dies cause longer heating process. The application temperature of high temperature durable bonding material (735) which composed of metal matrix composite (MMC) is much higher than the melting point of the typical solder. The protruded part (713-2) of heat sink (710) can keep as close (near) as to the surface of silicon chip (730) to provide the best overall thermal resistance because the bonding line thickness (BLT) of TIM 1.5 (730) is implemented as minimum as possible (referring to FIG. 7-1-2).

The heat dissipation package (700) provides much more overall heat flux flow than those two typical heat dissipation packages that shown in FIG. 5 and can meet the high TDP challenges of thermal management system for large monolithic silicon die (750). Moreover, the thin flexible die-exposed integrated heat spreader (IHS, 720) replaces the typical thick and rigid metal IHS (FIG. 5) because its curve-shaped mechanism (723) plays a key role as thermal stress damper to overcome the issue of thermal-induced deformation (such as warpage or die crack). The die-exposed integrated heat spreader (IHS, 720) is bonded quickly and firmly to the edges of silicon die (750) by using high temperature durable thermal interface material (735). The novel thin flexible die-exposed IHS foil (721) with high temperature durable bonding material (735) which made of specific metal matrix composite (MMC) paste or preform sheet not only provides more thinner thickness between Junction (Silicon Die) and Case (IHS Lid) of thermal dissipation package (FIG. 2 and FIG. 5) but also shows the resilience to absorb thermal-induced stress. This also prevents the happening of potential die-crack risk due to high thermal-induced stress during thermal cycling and power cycling.

Owing to the increasing frequency of computing cores and the limited die dimension for the chip package, the power density of the CPU chip is getting higher enormously. The high temperature spikes on the CPU chip resulted by the power density and is a threat to the processor's performance and chip's reliability. The CPU architect designer is forced to lower the system clock frequency and allocate the thread workflow to avoid the unexpected high temperature spikes happened in specific areas of the silicon chip and therefore deteriorates the computing efficiency of the CPU. Because of the die-exposed mechanism of the integrated heat spreader (IHS, 720), the heat flux from silicon die (750) can be directly transferred toward the heat sink (710) through the thermal interface material (TIM1.5, 730).

The areas, referred to as hot spots, have high temperature spikes that reach the rated operating temperature range of the CPU chip within a very short period (such as millisecond or less). Hot spots throttle the workload and performance of the individual silicon chip processor. Typical heat dissipation system cannot immediately respond to absorb the extra heat flux in the short high temperature spike period. Therefore, the phase change material (PCM), sometimes referred to as latent heat storage (LHS) material, can be useful in reducing the temperature peaks during high computing periods and balancing commutation of cores' workloads, and therefore reduces more demands on the thermal conduction and breaks the power throttling constrains of the processor. As FIG. 7-4 exhibited, the phase change material (PCM) can absorb instantly the conductive heat from the silicon die during its phase-change period from the solid state toward the liquid state as reach its melting temperature. Moreover, As shown in FIG. 7-5, the more (thicker) the phase change material (PCM) is used, the more heat can be absorbed and thus the peak temperature can be kept toward its melting point temperature longer.

Figure 2:
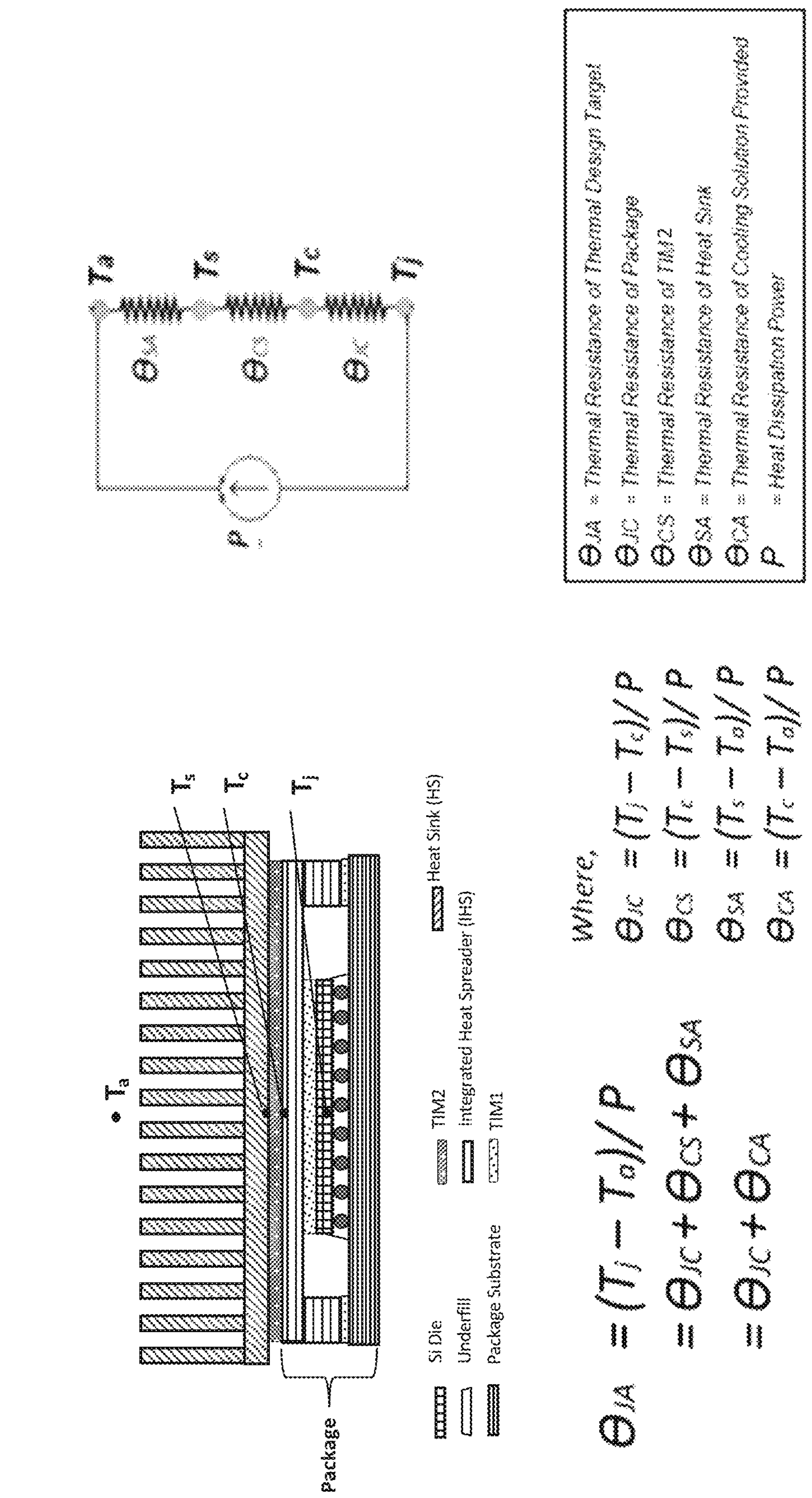
FIG. 2 illustrates the simple resistance model of heat dissipation system of typical monolithic silicon package (lidded type).

According to another embodiment of the present disclosure as shown in FIG. 7-2, the phase change material (PCM, 730-2) can perform its latent heat storage function to absorb the heat from the silicon die (750) intrinsically and then can lower the peak temperature of the silicon die (750) toward the melting point of the phase change material (PCM, 730-2). The more phase change material (PCM, 730-2) is used, the more heat can be absorbed and then the peak temperature can be kept toward the melting point of the phase change material (PCM, 730-2) longer (FIG. 7-5). The height of the heat sink supporter (714-2) can be defined as the proportional of the volume of the phase change material (PCM, 730-2) that filled in the container (715-2). The heat sink (HS, 710-2), the die-exposed area, and the integrated heat spreader (IHS, 720) together form a confined container (715-2) to storage the phase change material (PCM, 730-2). Normally the phase change material (PCM, 730-2) has very a low thermal conductivity (such as the paraffin wax has a lower thermal conductivity about 0.2 W/MK). In order to improve the overall thermal conductivity between the heat sink (HS, 710-2) and the integrated heat spreader (IHS, 720), high thermal conductivity particles (such as Cu particles, no shown) are mixed within the phase change material (PCM, 730-2), herein referred to as hybrid phase change material (hybrid PCM), and then this hybrid phase change material (hybrid PCM) is filled into the container (715-2) through the vent (712-2) of the heat sink (710-2). Fin array (713-2) of the heat sink (710-2) is also immersed with hybrid phase change material (hybrid PCM) for the same purpose to enhance overall thermal conductivity of the heat dissipation system.

Figures 1, 8:
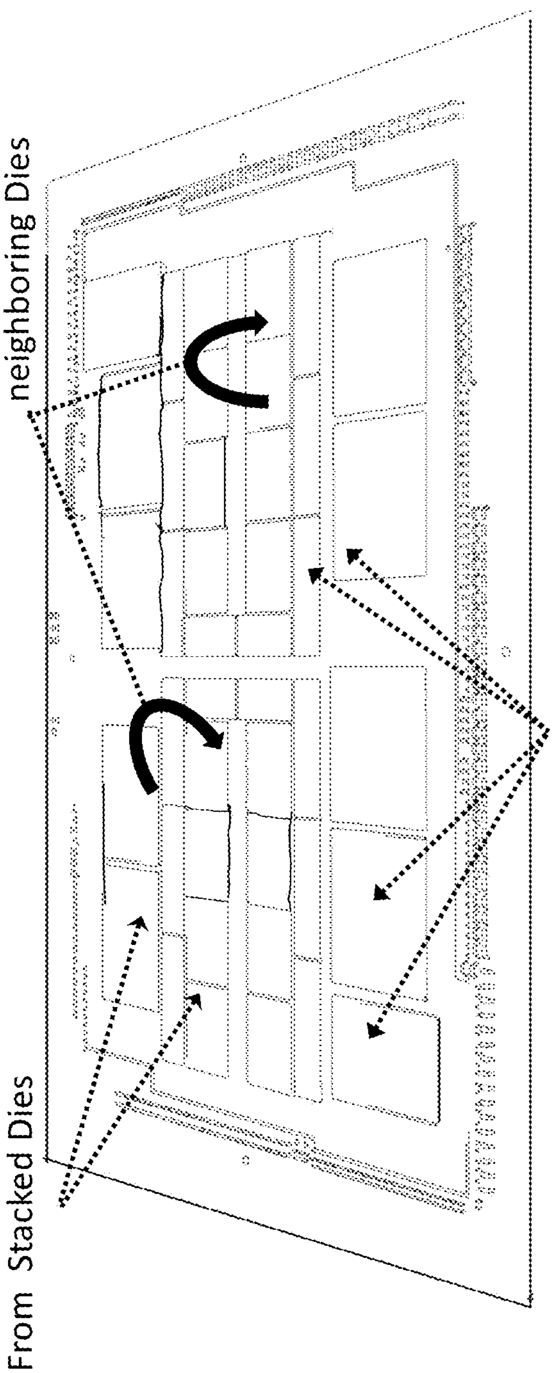
Figures 2B, 8:
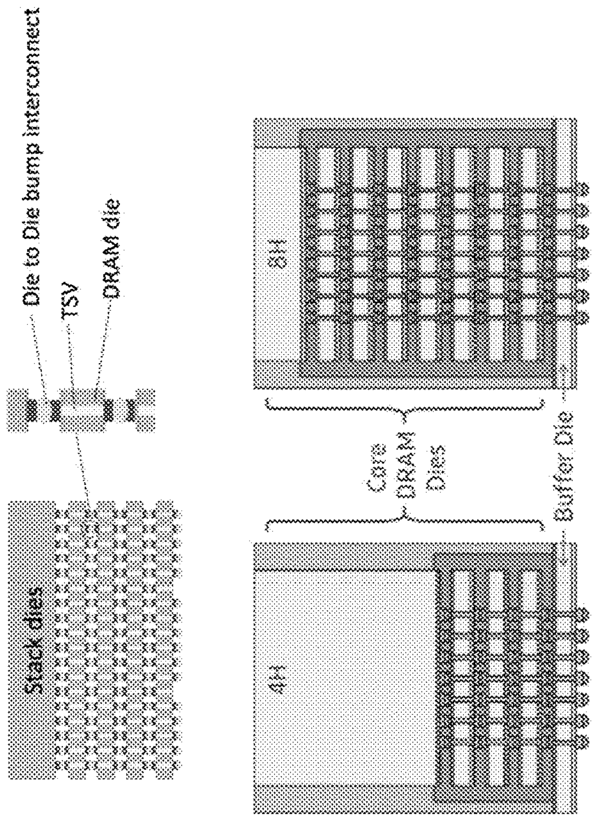

As shown in FIG. 5-2B, U.S. Pat. No. 9,646,910 B2 discloses the related experiments data charts that show the relationship between the silicon chip surface temperature drop and diameter/spacing/heights of the fin array. It is implied that the distribution density of the fin array (713-2) can be coped with the hot spots area of the silicon chip to provide more efficiency in the heat dissipation. The fin array is arranged in more denser corresponding to the more hot-spots located (refer to FIG. 7-2-1). It was reported in "A REVIEW ON TRANSIENT THERMAL MANAGEMENT OF ELECTRONIC DEVICES, Jhon Mathew and Shankar Krishnan, 2022" that transient thermal management solutions play essential role to ensure the performance and reliability of high-performance computing (HPC) applications, such as high TDP CPU/GPU or AI and Data Center. Typical steady-state thermal management (shown in FIG. 2 and FIG. 5) is not suitable for those high-power density and high temperature swing applications any more.

As FIG. 7-6A shown, there are five power electronic package stacks are analyzed in transient thermal management of power electronics. FIG. 7-6B shows the junction temperature response of Case 1, 3 and 5 to a square pulse train with 1 watt/cm$^2$ power, 1 second period, and 10% duty cycle (100 ms pulse width). The final set of pulses in the pulse train is shown in the graph (well after the slower Case 1 package has achieved steady-state temperature oscillations). It is obviously clear that the "improved and better" packages 3 and 5 actually have worse performance with respect to peak temperature rise. The minimum and maximum temperatures seen by the junction during the pulses are listed in following table:

| Case | $T_{min}$ [K/(W/cm$^2$)] | $T_{max}$ [K/(W/cm$^2$)] | $T_{max}$ % diff | ΔT [K/(W/cm$^2$)] | ΔT % diff |
|---|---|---|---|---|---|
| #1 | 0.11 | 0.29 | — | 0.18 | — |
| #3 | 0.01 | 0.38 | 30 | 0.37 | 106 |
| #5 | 0 | 0.90 | 207 | 0.90 | 401 |

Normalized temperature rise for Case 1, 3, 5

The faster thermal responses of Cases 3 and 5 cause peak temperatures ($T_{max}$) to exceed Case 1 by 30% and 207%, while the increased heat rejection rates lead to temperature swings (ΔT % diff) 106% and 401% larger, also. This case shows that although the absolute magnitudes of the AC analysis may not directly translate to pulsed response, the qualitative result of degraded performance over certain operating regimes appears to be valid. As expected, however, Case 3 and Case 5 do thermally reset (heat discharge) much faster than the Case 1. This would allow devices to switch at higher pulse rates without resulting temperature increases (remaining heat accumulation).

Typical steady-state thermal management system of microelectronics devices often results in over-designed cooling systems that are sized in basis of peak loads according the definition of thermal design power (TDP). It can also result in undesirably large temperature swings when pulsed heat load employed. Large temperature variations within short period of time cause thermo-mechanical fatigue effects (thermal-induced deformation: warpage and stress due to the CTE mismatches of different materials) that endanger device reliability. Therefore, metallic/hybrid PCMs (mentioned in "A REVIEW ON TRANSIENT THERMAL MANAGEMENT OF ELECTRONIC DEVICES") are found to be suitable cooling solutions for the applications involving short-duration high-power pulses. An important aspect of transient thermal management is the appropriate selection (FIG. 7-8) of the overall thermal resistance (R) and thermal capacitance (C) of the cooling package. The "thermal time constant (see the definition as below)" must be designed to be larger than the time period of the power cycles in order to reduce temperature deviations. Heat dissipation systems offering tunable thermal resistance (R) and thermal capacitance (C) show much promise for future transient thermal management applications as they can dynamically adapt to time-varying workloads.

Therefore, transient thermal management systems should focus on selecting appropriate thermal resistance (R) and thermal capacitance (C) values such that (1) the junction temperature swing is lowered, and (2) the total time period of thermal response is matched with the time period of the pulsed load. An equivalent R—C thermal circuit of the model is shown in FIG. 7-7A. FIG. 7-7B shows the applied transient heat pulse, while FIG. 7-7C presents the corresponding temperature responses for the three Cases. In Case 1, the high thermal resistance (R) and low thermal capacitance (C) result in a rapid temperature excursion (large $\Delta T_j$) during the heating cycle (heater "on") and in an incomplete dissipation of the stored thermal energy during the cooling cycle (heater "off"). As a result of the thermal energy accumulated in each heating cycle, the peak junction temperature can be seen to rise with each subsequent cycle whereas for Case 2 involving low thermal resistance (R) and high thermal capacitance (C), the temperature rise during each heating cycle is suppressed (thermal time constant is much larger than the time period of the power cycles). Moreover, there is a lesser accumulation of thermal energy during the cooling cycle as the stored heat is dissipated more readily. Case 3, which involves a low thermal resistance (R) and low thermal capacitance (C), exhibits a similar thermal response as Case 1. The peak junction temperature increases rapidly under a pulsed power input on account of its small thermal capacity. Therefore, heat dissipation system with low R and high thermal capacitance (C) as Case 2 described (Type II in FIG. 7-8) is suitable for high power density microprocess and data server application.

Figures 7, 8:
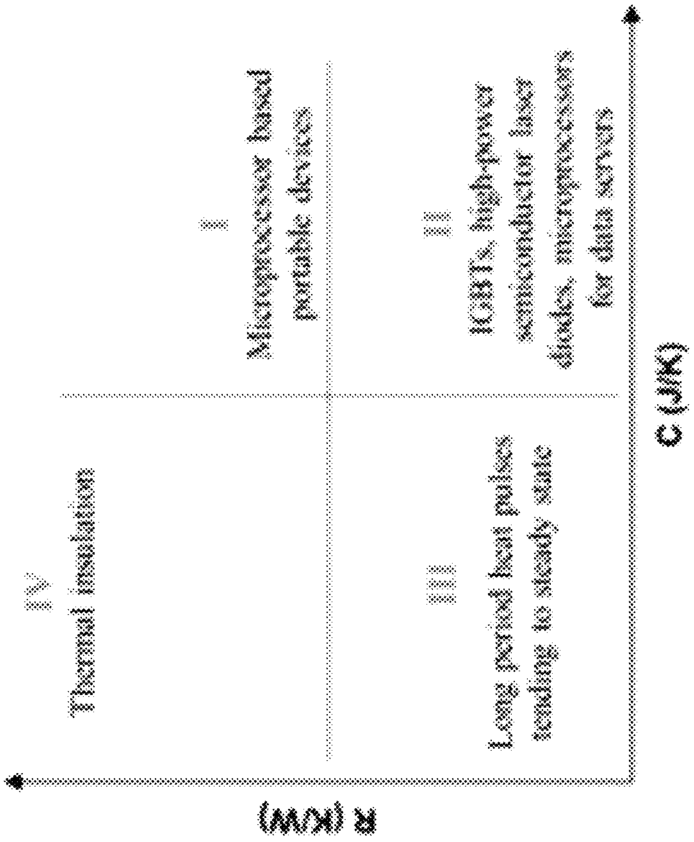

For high-performance computing (HPC) applications in which only the junction temperature ($T_{jmax}$) is limited, the package should be designed with a low thermal resistance (R) and high thermal capacitance (C). This will facilitate the reduction of the maximum temperature amplitude as well as suppress temperature increment rates. This thermal design guidelines on appropriate thermal resistance (R) and thermal capacitance (C) combinations for different applications are depicted in FIG. 7-8. In the case II, thermal system designs should employ low thermal resistance (R) and high thermal capacitance (C) such that the thermal time constant, s=RC, is higher than the period of the pulsed load. This is the purpose that the novel integrated heat spreader (720) and the metallic/hybrid PCM (730-2) shown in FIG. 7-2 can have capability to lower overall thermal resistance and increase overall thermal capacitance of thermal management system. In other words, novel integrated heat spreader (IHS, 720) of integrated hybrid heat dissipation system (IHHDS) contributes similar low thermal resistance (R) as lidless package (shown as FIG. 5(*a*)). Novel hybrid combination of TIM1.5 (PCM, 730-2) and heat sink (710-2) also can provide more thermal capacitance (C) than typical lidded package (shown as FIG. 5B).

Figures 3, 6:
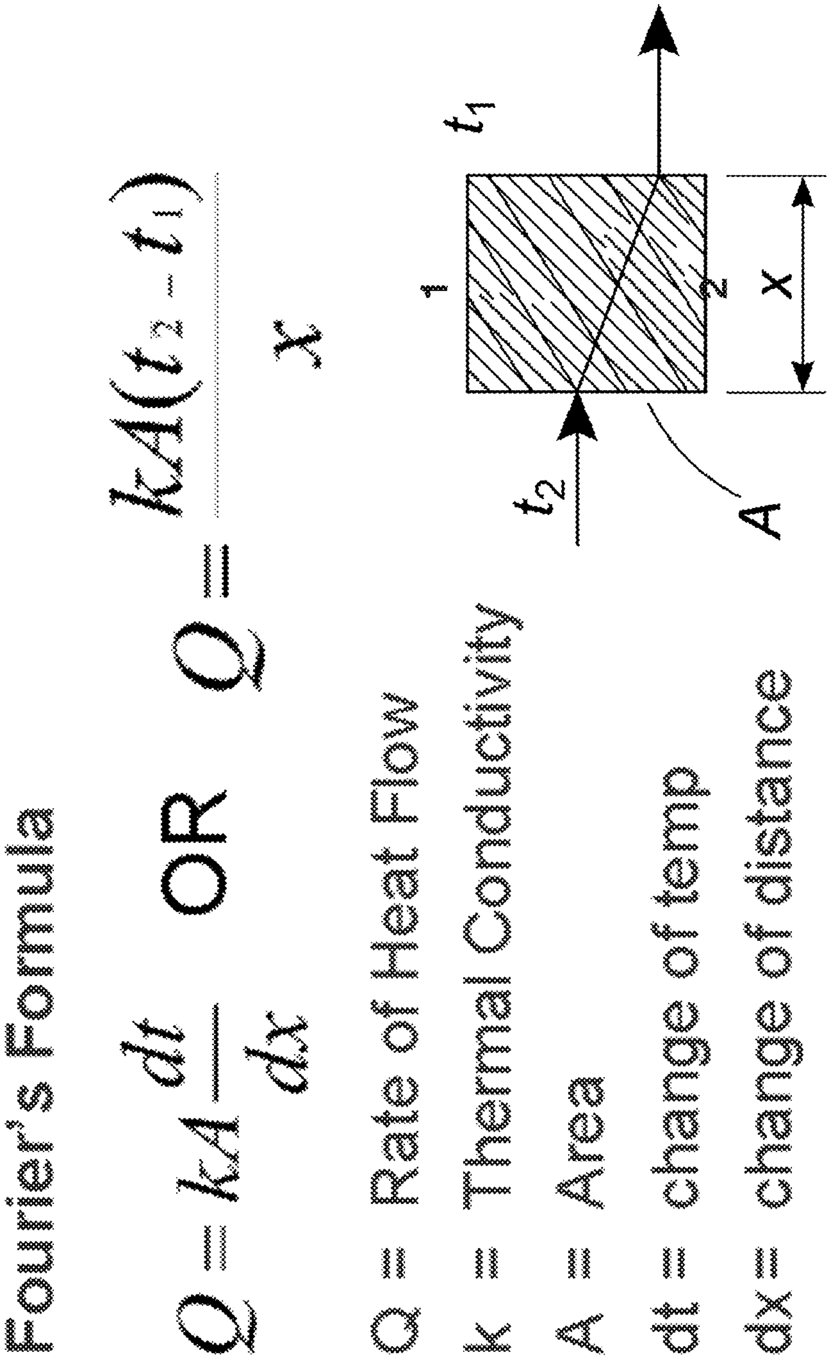

As the emerging ultra high TDP (>400 W) and ultra-high power density (>10 W/cm$^2$) of modern high performance computing (HPC) applications, the limited phase change material (PCM) container (715-2) of IHHDS (FIG. 7-2) cannot have enough PCM to absorb the huge heat spikes from package in order to avoid thermal throttling issue (Dark Silicon). Therefore, the high-performance liquid cooling or the microjet hotspot-targeted cooler may be taken into the consideration. As shown in FIG. 7-3-2A, FIG. 7-3-2B and FIG. 7-3-2C, lidded cooling (FIG. 7-3-2A) and direct cooling (FIG. 7-3-2B) both has micro-pins built on the surface of lid and silicon die separately. It is also discussed that the shape (diameter, and height) of micro-pins and the liquid flow rate can affect the overall capability of heat dissipation system. Unfortunately, this system cannot provide the solution for the hot spot issue of large die. Moreover, FIG. 7-3-2C exhibits microjet hotspot-targeted cooling and also discusses how the jet nozzle, distribution and velocity (liquid flow rate) affects overall thermal dissipation system. In FIG. 7-3, it shows the example of IHHDS with full micro-jet array and FIG. 7-3-1 shows the well distribution jet streams on the top view of A-A' of FIG. 7-3. Cold liquid (730-3) is filled into inlet chamber (716-3) through inlet vent (711-3) and is jetted on to the surface of silicon die (750) directly through jet nozzles (714-3). Heated liquid is also filled into outlet queue chamber (718-3) through restored nozzles (717-3) and then pump out through outlet vents (712-3). Direct jet impingement of cold liquid has much better cooling effect than flow-over on the surface of silicon die. Moreover, the hotspot-targeted nozzles distribution also delaminates the thermal throttling effectively.

Figures 1, 9:
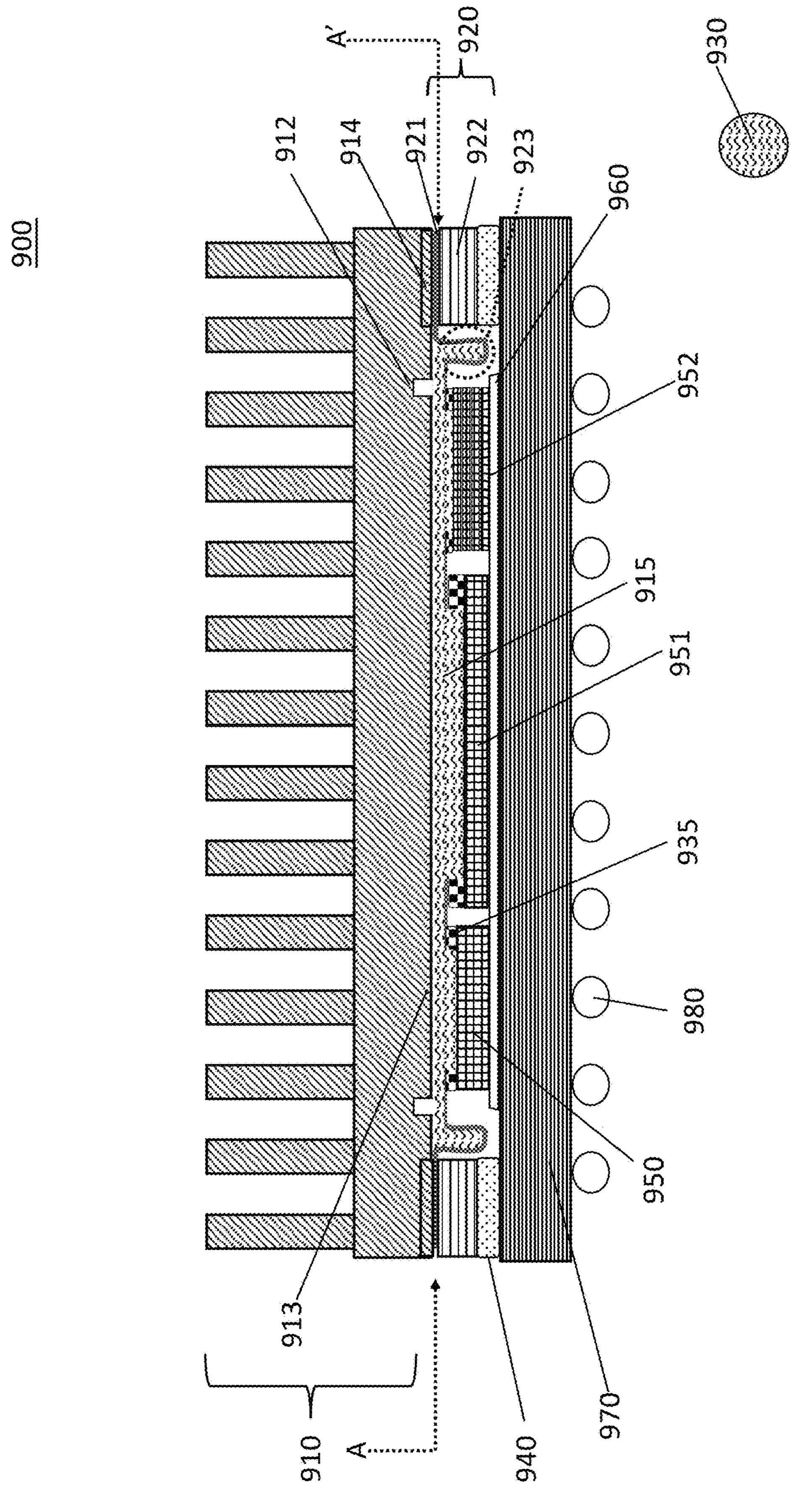
Figures 1, 9:
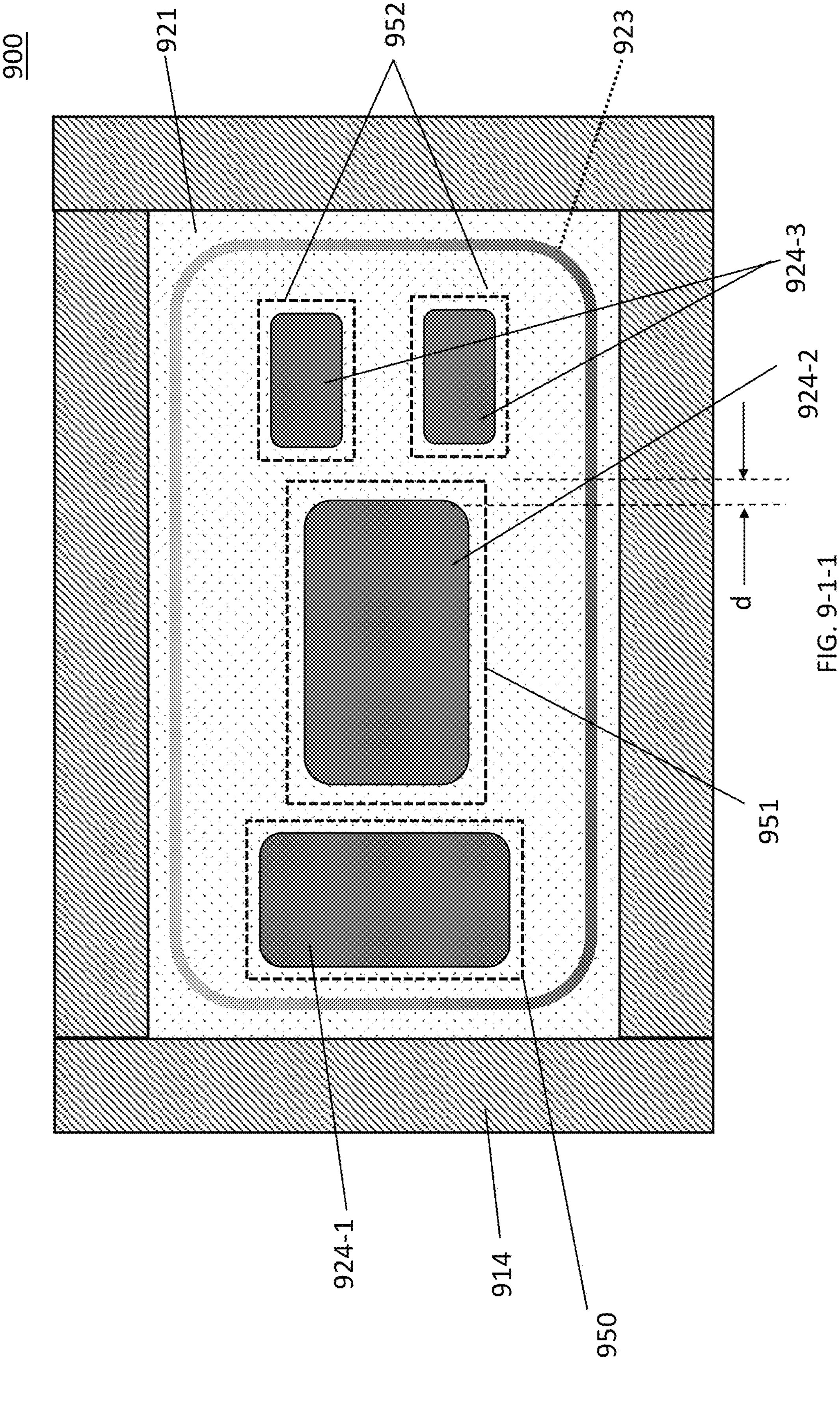
Figures 1, 2, 9:
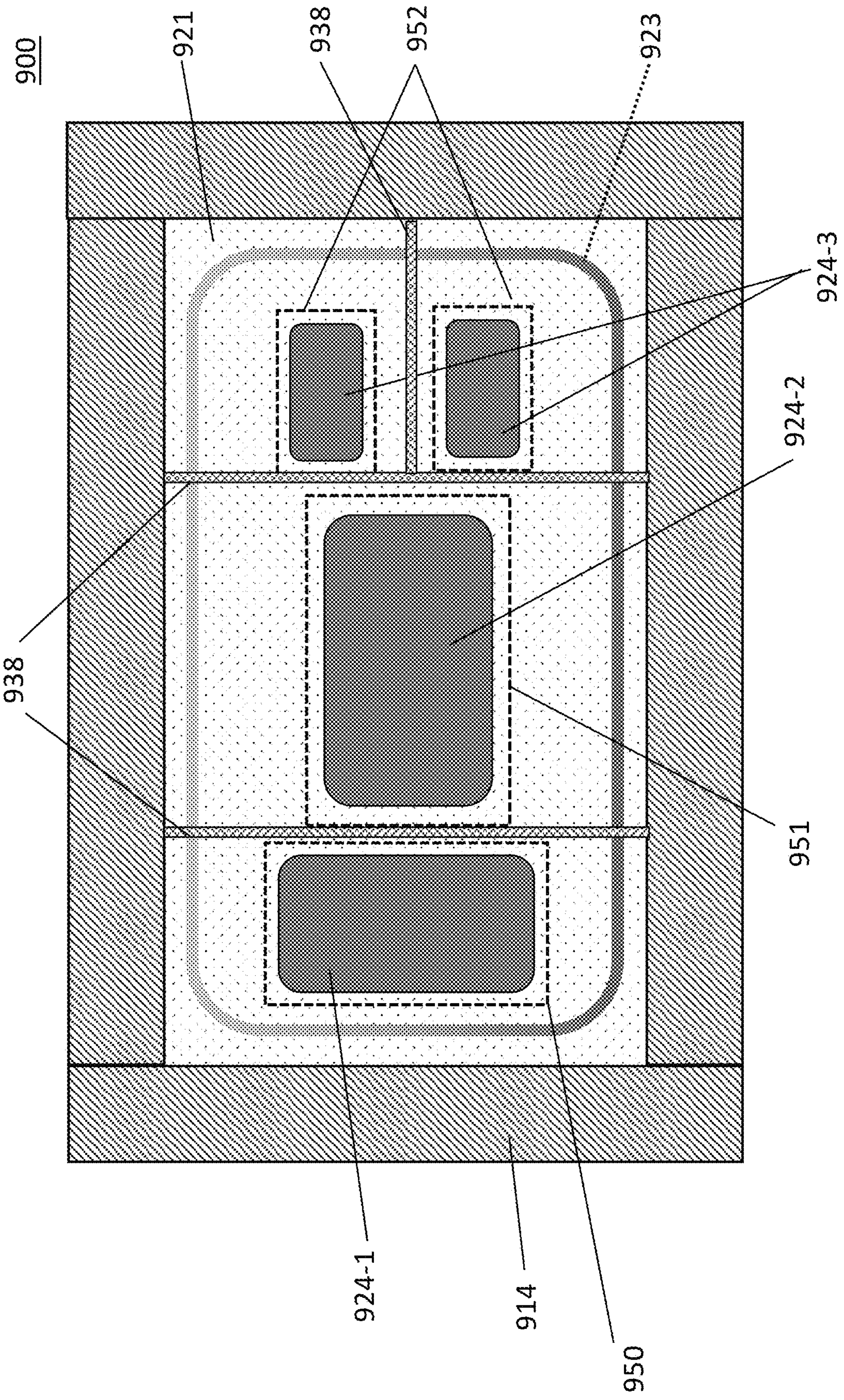
Figures 1, 3, 9:
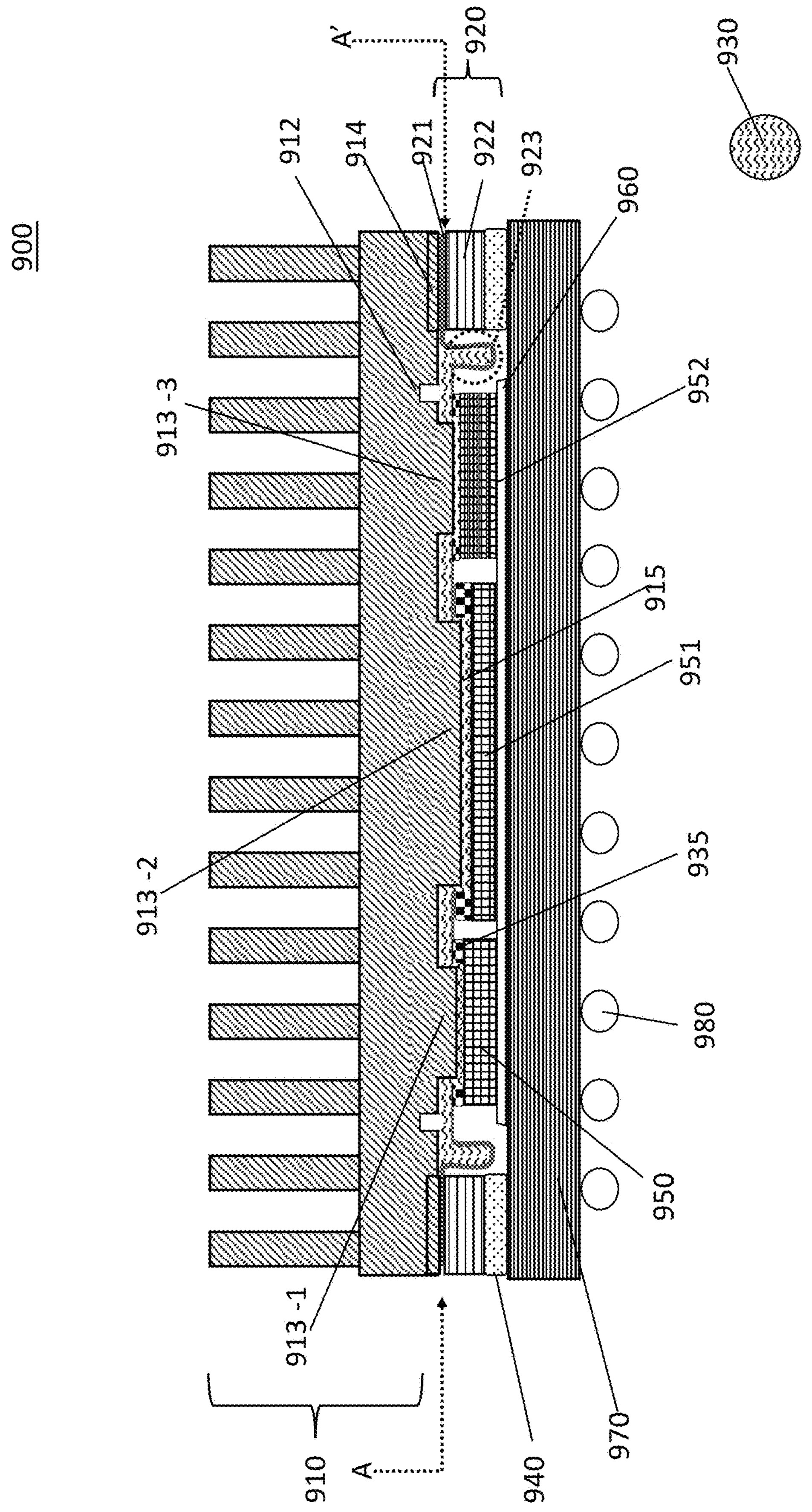
Figures 2, 9:
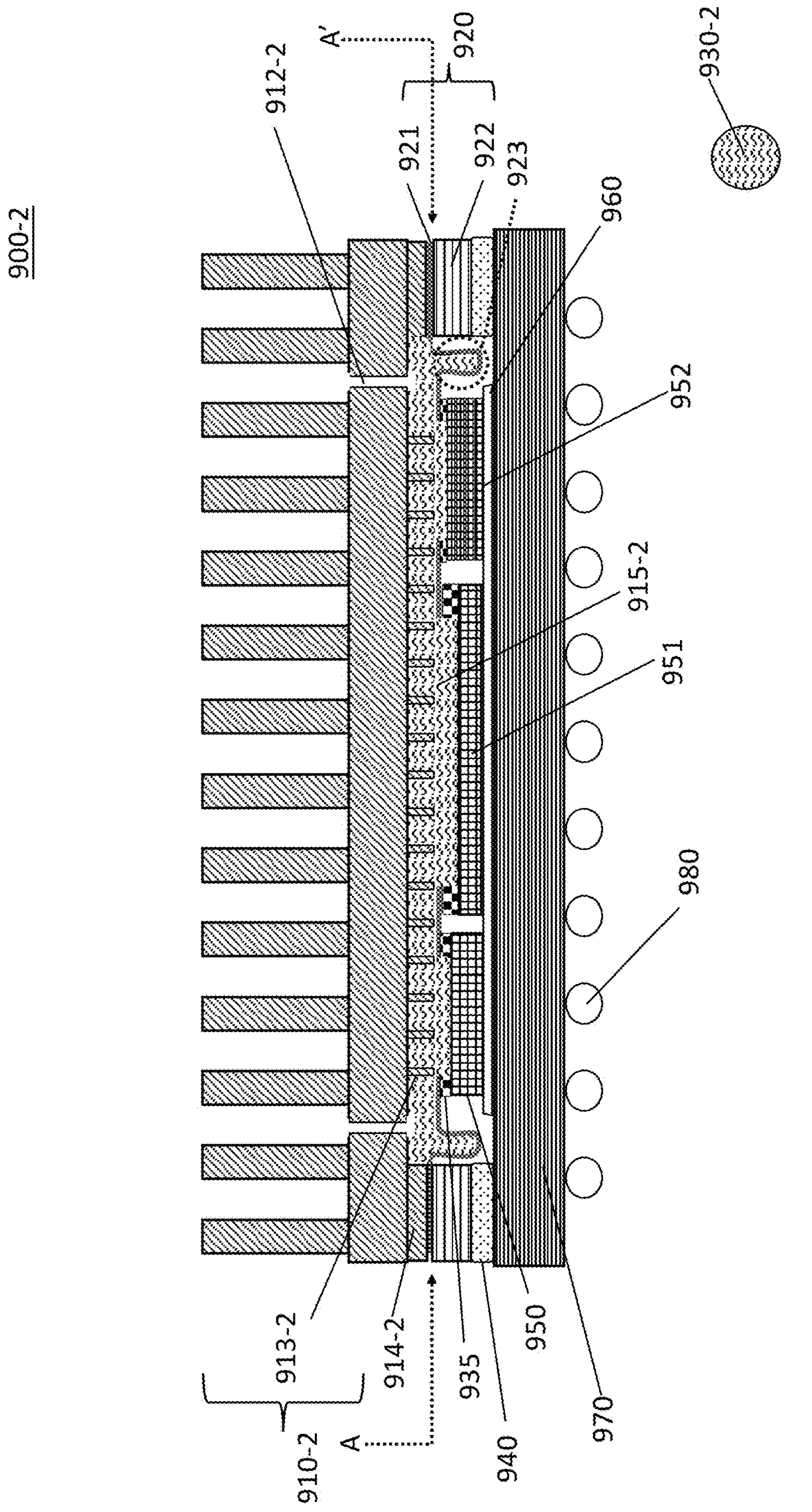
Figures 1, 2, 9:
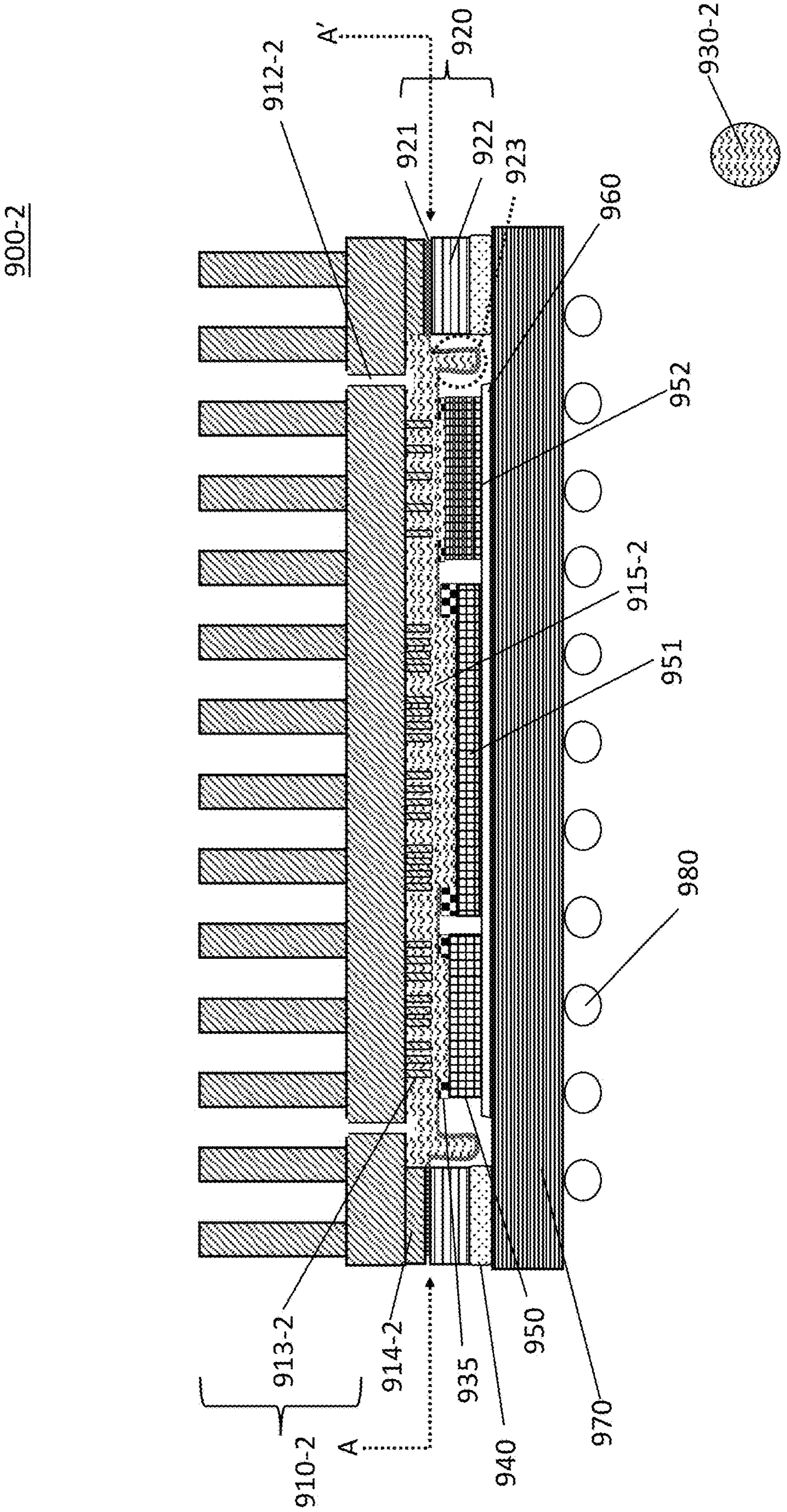
Figures 3, 9:
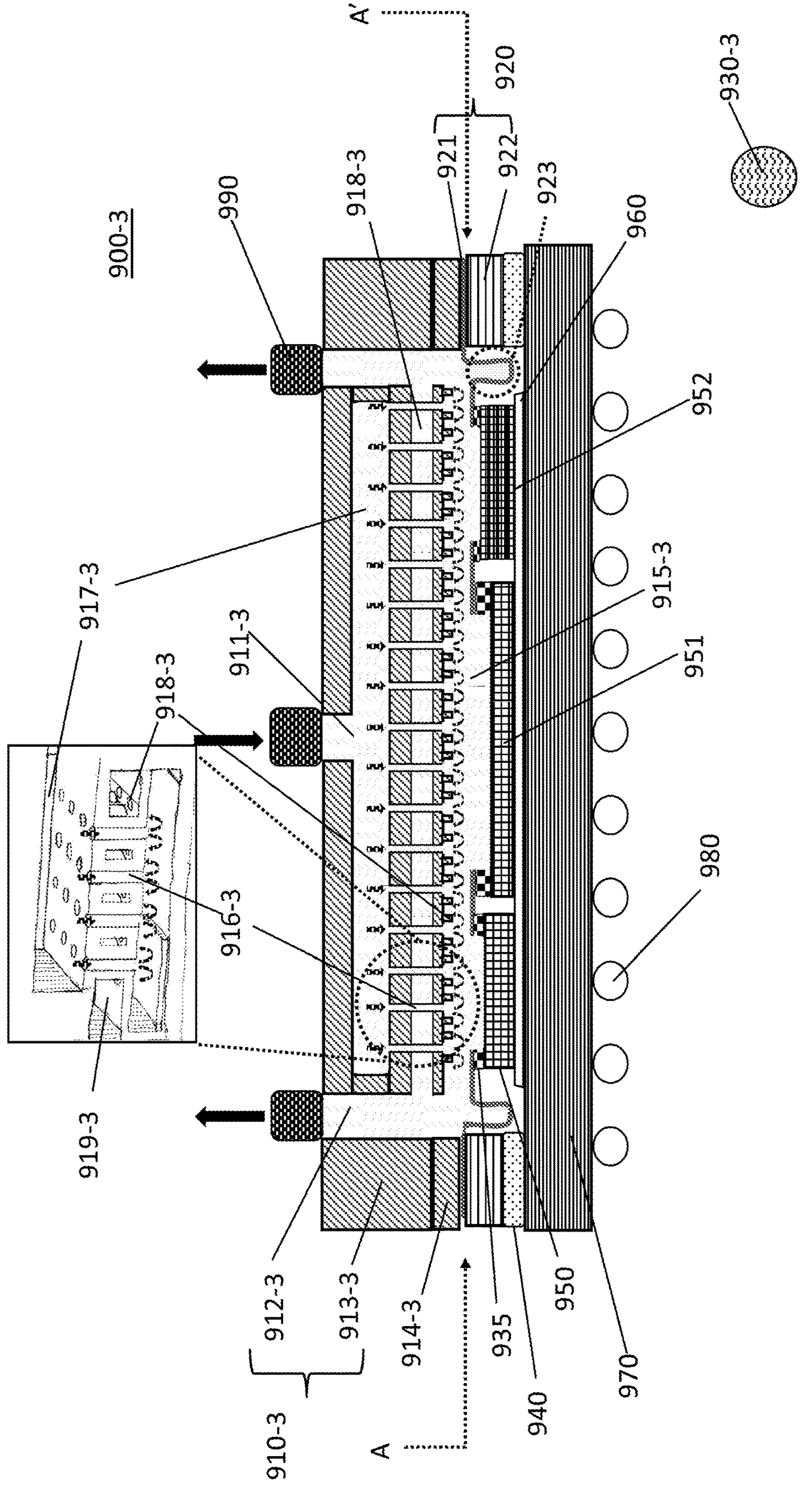
Figures 1, 3, 9:
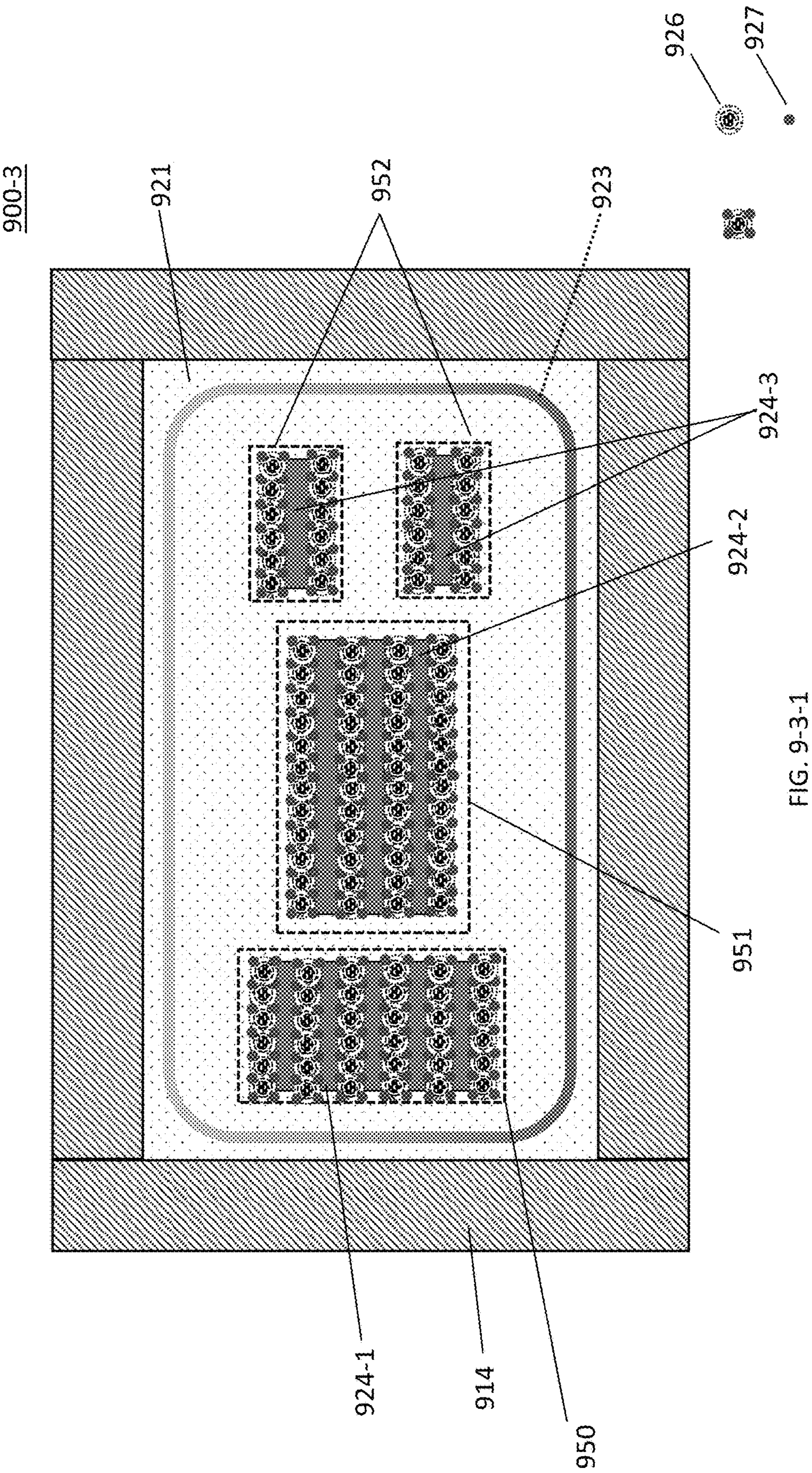

In FIG. 9-1, there is new package system (900) of heterogeneous integration to provide thermal management system of hybrid package (such as the package shown in FIG. 8-1) that includes chiplets with different sizes, heights and structures. Such as small/tall silicon die (950), flat/large silicon die (951) and stacked silicon dies (952) which mounted on interposer (960) by micro bumps (no shown) and interposer (960) also is mounted on PCB substrate (970) by micro bumps (no shown). A thin flexible dies-exposed integrated heat spreader (IHS, 920) which comprises the flexible dies-exposed IHS foil (921) and IHS foil supporter (922) is sealed with PCB substrate (970) with sealant (940). The thin flexible die-exposed IHS foil (921) is composed of high thermal conductivity material such as copper foil or other metal coated composite foil which made of graphite, graphene or carbon nanotube (CNT) inside. Thin flexible dies-exposed IHS foil (921) has curve-shaped thermal-induced stress absorbing mechanism (923) on lateral ends (refer to FIG. 9-1-1, the top view of A-A' of FIG. 9-1) and is bonded firmly on silicon dies (950, 951, and 952) with high temperature durable bonding material (935) such as metal matrix composite (MMC) mentioned as above. A heat sink supporter (914) is bonded hermetically on integrated heat spreader (IHS, 920) by sealant (not shown) and then a cavity-like container (915) is formed in between heat sink supporter (914), exposed silicon dies, and integrated heat spreader (IHS, 920) where the height of heat sink support (914) is higher than the thickness of thermal interface material (TIM 1.5, 930). Thermal interface material (TIM1.5, 930) is applied into the container (915) and covered on the top of thin flexible die-exposed IHS foil (921) and die-exposed area in the container (915) completely where thermal interface material (TIM1.5, 930) is different with typical TIM1 and TIM2 (shown in FIG. 5) because it is applied between exposed silicon die, flexible die-exposed IHS foil (921), and heat sink (910). Then the heat sink (910) with empty vents (912) and protruded part (913) are attached to the top of heat sink supporter (914) by sealant or other mechanical attachments (such as screws, not shown) and contacted with the surface level of thermal interface material (TIM1.5, 930) as close as possible to keep good contact interface for better thermal conduction. The empty vents (912) can be tolerated the volume change of thermal interface material (TIM1.5, 930) during thermal cycling-Therefore, IHS foil (921) not only has good adhesion with thermal interface material (TIM1.5, 930) and high temperature durable bonding material (935) but also forms the good interface contact resistance between Thermal interface material (TIM1.5, 930) and high temperature durable bonding material (935). Meanwhile, the temperature of this quick bonding process (such as quick TCB or other solid-state thermosonic bonding) is relatively lower than the typical solder and the shorter bonding period can avoid the damage of silicon dies cause longer heating process. The application temperature of high temperature durable bonding material (935) which composed of metal matrix composite (MMC) is much higher than the melting point of the typical solder. In addition, the protruded parts (913-1, 913-2, and 913-3) of heat sink (910) can have different heights to mate with the different thickness and structure of individual chip to provide the best overall thermal resistance for individual chip. (Refer to FIG. 9-1-3)

Moreover, thickness of high temperature durable bonding material (935) on each silicon die is different because silicon dies have different height. In other words, the total height that each silicon die height plus the thickness of high temperature durable bonding material (935) is almost same. As FIG. 9-1-2 shown, isolated supporter grids (938) which composed of heat isolated material with low thermal conductivity is attached onto flexible die-exposed IHS foil (921) in order to apply different TIM1.5 onto different area for better overall thermal performance and avoid the thermal cross-talk between neighboring silicon dies or area.

For higher TDP HPC heterogeneous integration (refer to FIG. 9-2), the hybrid PCM (930-2) is applied and filled into the container (915-2) through vent (912-2) of heat sink (910-2). Well-distributed fin array (913-2) of heat sink (910-2) are also immersed with hybrid phase change material (hybrid PCM, 930-2) for increasing the thermal performance of whole heat dissipation system. In addition, the distribution density of fin array (913-2) can be adjusted to cope with the hot spots located area of silicon chip.

For ultra-high TDP (>400 W) and ultra-high-power density (>10 $W/cm^2$) of HPC applications, the example of microjet impingement cooling heat dissipation system is shown as FIG. 9-3. In FIG. 9-3-1 shows the well distribution jet streams in individual die-exposed die area (924-1, 924-2, and 924-3) on the top view of A-A' of FIG. 9-3. Cold liquid (930-3) is filled into inlet chamber (917-3) through inlet vent (911-3) and is jetted onto the surface of silicon dies (950, 951, and 952) through jet nozzles (915-3). Heated liquid is also filled into outlet queue chamber (919-3) through restored nozzles (918-3) and then pump out through outlet vents (912-3). Direct jet impingement of cold liquid has much better cooling effect than horizontal flow-over on the surface of silicon die. Moreover, the hotspot-targeted nozzles distribution also delaminates the thermal throttling effectively.

Figures 1, 10:
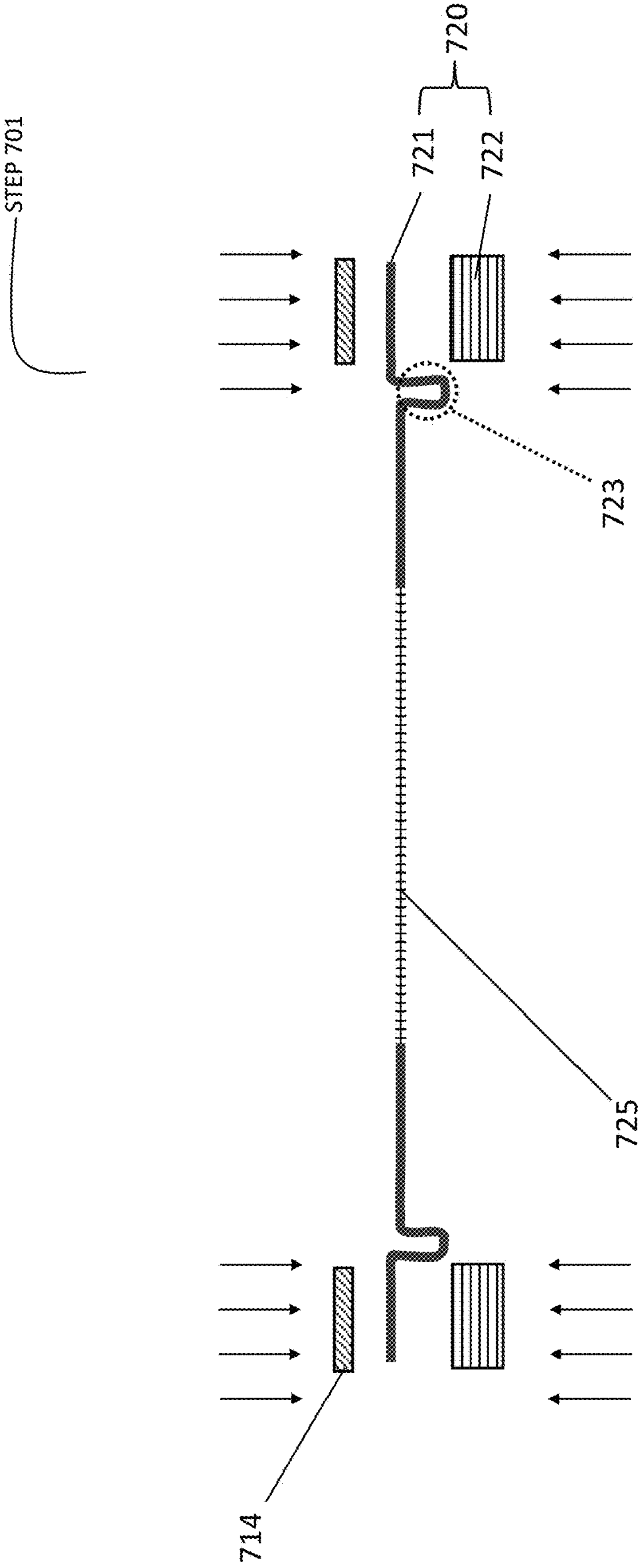
Figures 2, 10:
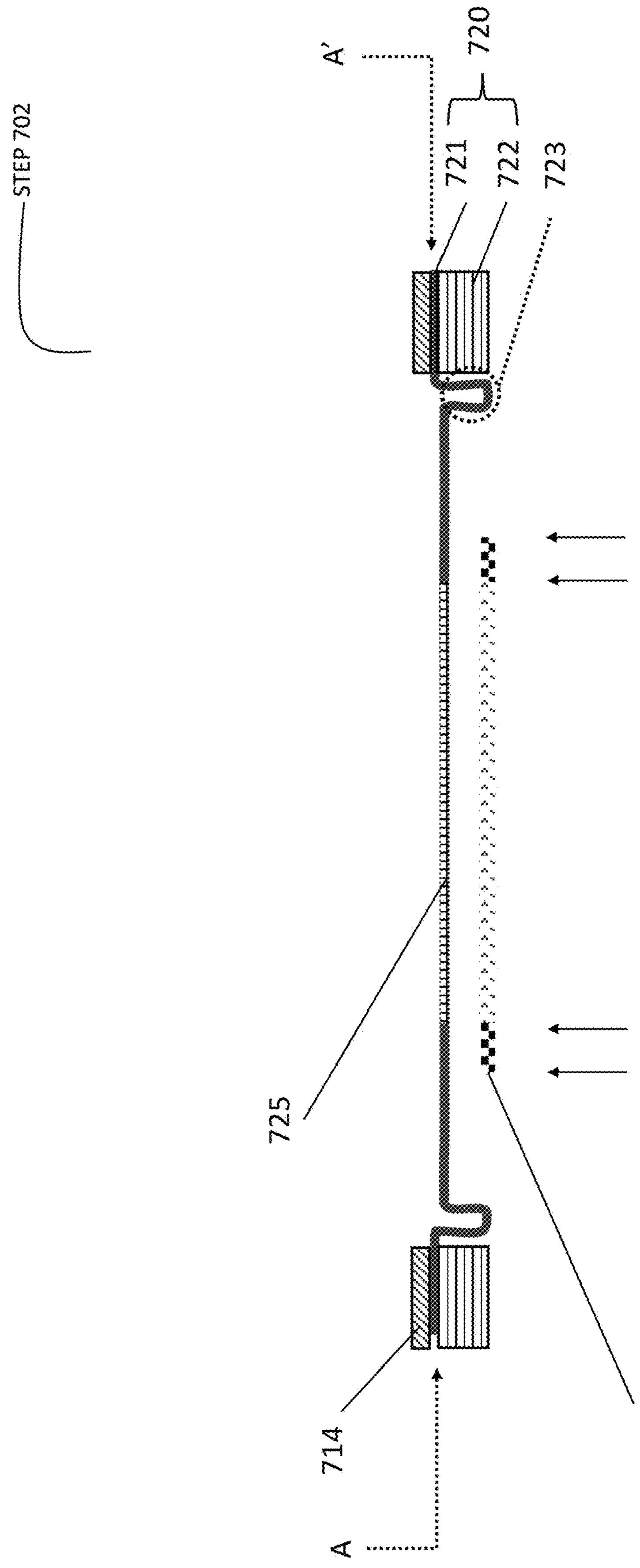
Figures 3, 10:
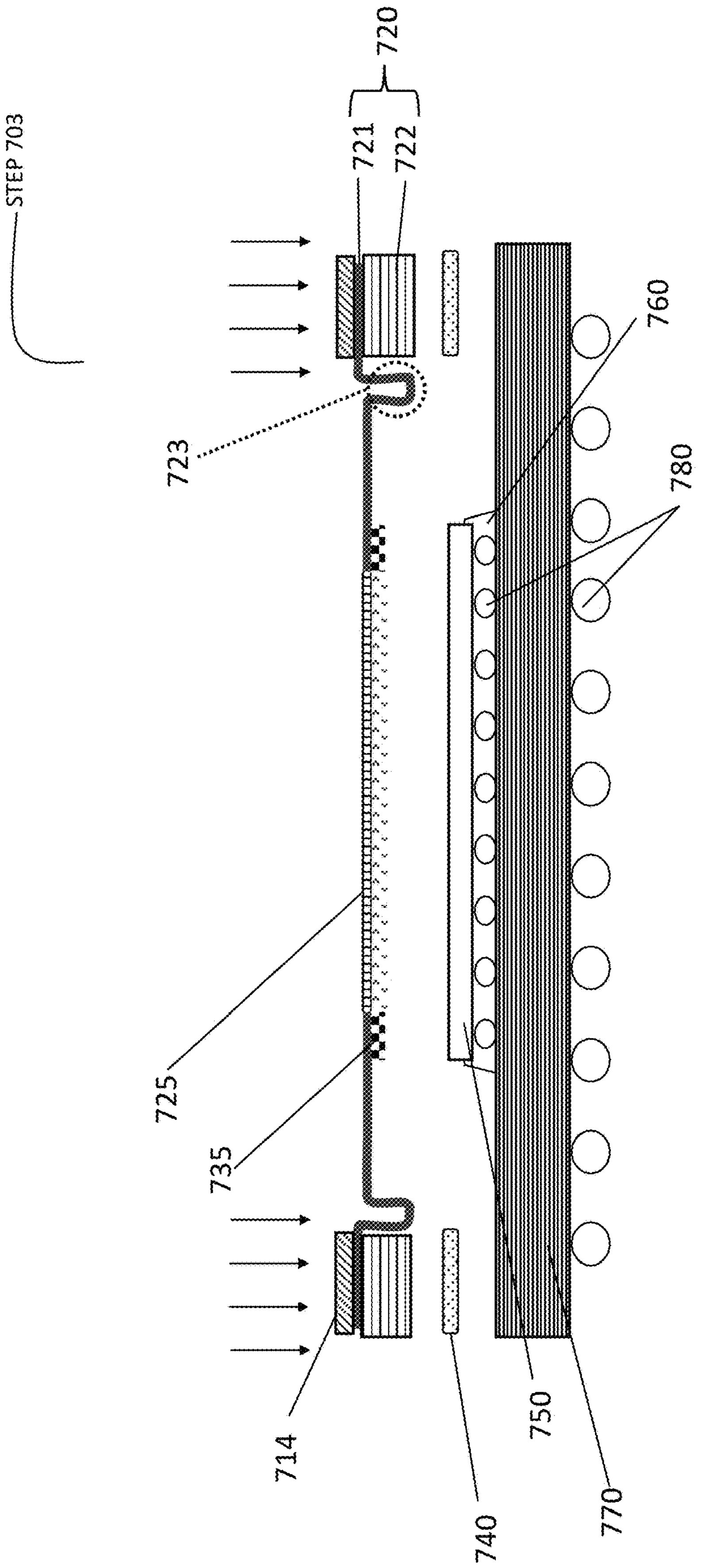
Figures 4, 10:
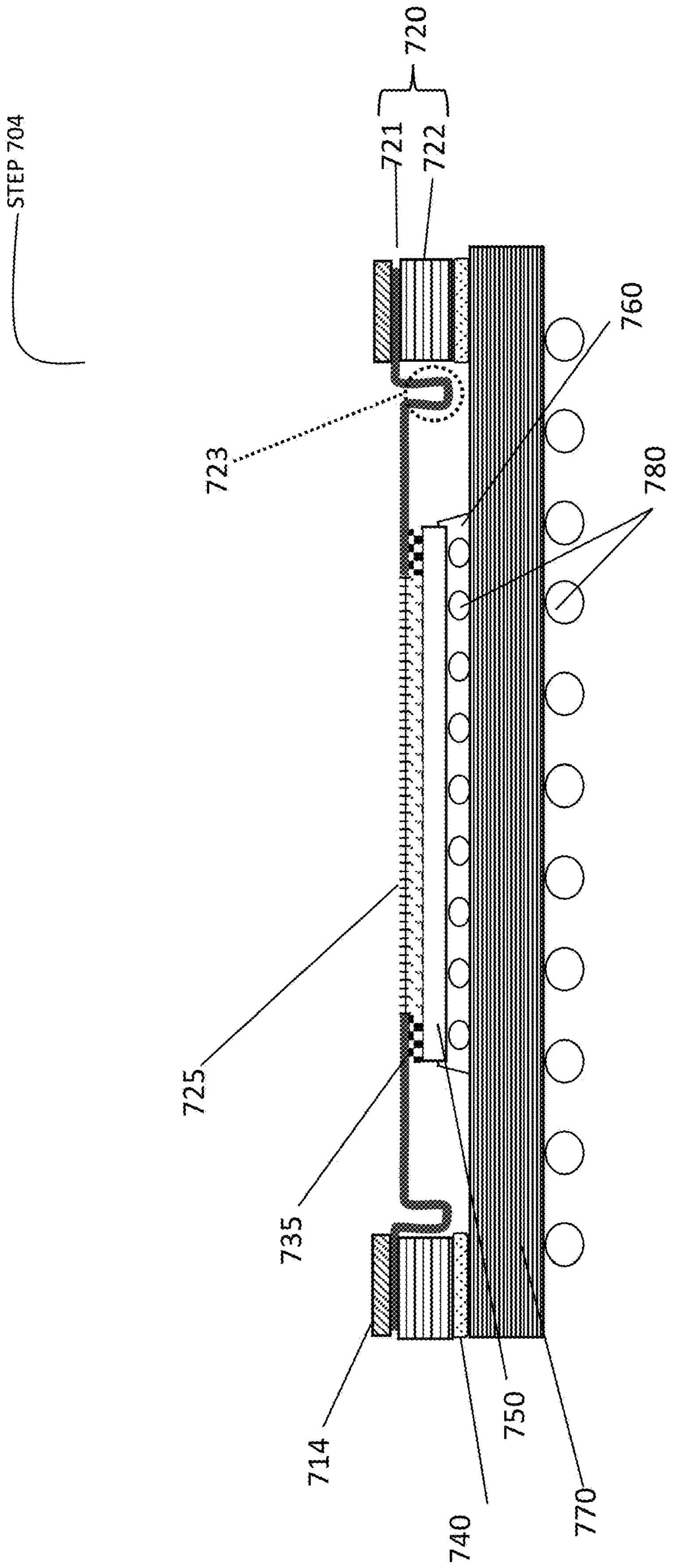

In accordance with one embodiment of the present disclosure, FIG. 7-1 is a schematic diagram illustrating the cross-section view of IHHDS (700) for a silicon die. A large silicon die (750) mounted on a PCB substrate (770) by flip-chip solder balls (780) and infiltrated with underfill (760) between the gap of silicon die (750) and PCB substrate (770). An integrated heat spreader (IHS, 720) includes a thin flexible IHS foil (721) and an IHS supporter (722), wherein the IHS foil has a hollowed out central area and a curve-shaped thermal-induced stress absorbing mechanism (723) on its lateral ends and bonded with the IHS supporter (722) hermetically. The thin flexible die-exposed IHS foil (721) is composed of high thermal conductivity material such as copper foil or other metal coated composite foil which made of graphite, graphene or carbon nanotube (CNT) inside. In FIG. 10-1, STEP 701 exhibits the process to hermetically bond the heat sink supporter (714) and the integrated heat spreader (720) together. In FIG. 10-2, STEP 702 exhibits that the high temperature durable bonding material is applied to the back side of die-exposed hollowed integrated heat spreader (720) with good alignment, and then bonds the integrated heat spreader (720) to the peripheral edges of the die in such a manner that a major portion of the die is exposed out through the hollowed out central area of the integrated heat spreader. The high temperature durable bonding material (735) is composed of metal matrix composite (MMC) with quick/short process period less than about 5 minutes, higher re-melting point more than 300° C., higher thermal conductivity and better contact interface with mating surfaces. In FIG. 10-3, STEP 703 exhibits that the integrated heat spreader (720) is hermetically bonded with the backside metallization (no shown) of the silicon chip with the high temperature durable bonding material (735). IHS supporter (722) is sealed toward the PCB substrate (770) with the sealant (740). The above bonding process can be conducted in the same time or one after another. Finally, the thermal interface material (TIM 1.5, 730) is applied into the cavity-like container (715) to cover the top surface of backside metallization of the silicon die and the integrated heat spreader (720). In some case, the high thermal conductivity thermal interface material (TIM1.5, 730) such Indium or liquid metal composite with low modulus will become liquid-like phase as temperature goes high and thus is not easily fixed on the surface of silicon die. The cavity-like container (715) can confine the liquid-like thermal interface material and seal it inside the cavity without any leakage. Then the heat sink (710) is fixed and attached to the heat sink supporter (714). The heat sink with vents (712) can accommodate the expansion or shrinkage of TIM 1.5 (730) during thermal cycling.

FIG. 7-1-1 is a schematic diagram illustrating the top view A-A' of FIG. 7-1, the cross-section view of IHHDS (700) for monolithic silicon die. The silicon die (750) is located at the middle of the thin flexible die-exposed IHS foil (721). The die-exposed area (724) of the thin flexible die-exposed IHS foil (721) is smaller than the area of the silicon die (750) and the edge-to-edge distance (d) is about 2-3 mm for the attachment area of the high temperature durable bonding material (735). The thermal-induced stress absorbing mechanism (723) of the thin flexible die-exposed IHS foil (721) is located laterally between the silicon die (750) and the IHS supporter (714).

FIG. 7-1-2 is a schematic diagram illustrating the cross-section view of IHHDS (700) for monolithic silicon die with protruded part of the heat sink. The protruded part (713) of the heat sink (710) shortens the distance with the silicon die (750) as less bonding line thickness (BLT) of the thermal interface material (TIM 1.5, 730) as possible in order to achieve the best thermal performance.

FIG. 7-2 is a schematic diagram illustrating the cross-section view of IHHDS (700-2) for the monolithic silicon die with the phase change material and the uniform distributed fin array embedded heat sink. A large silicon die (750) is mounted on the PCB substrate (770) by flip-chip solder balls (780) and is infiltrated with underfill (760) between the gap of the silicon die (750) and the PCB substrate (770). The integrated heat spreader (IHS, 720) includes a thin flexible IHS foil (721) and an IHS supporter (722). The IHS foil has a curve-shaped thermal-induced stress absorbing mechanism (723) on its lateral ends and hermetically bonded with the IHS supporter (722). The thin flexible die-exposed IHS foil (721) is composed of high thermal conductivity material such as copper foil or other metal coated composite foil which made of graphite, graphene or carbon nanotube (CNT) inside. In FIG. 10-1, STEP 701 exhibits the process to hermetically bond the heat sink supporter (714) and the integrated heat spreader (720) together. In FIG. 10-2, STEP 702 exhibits that the die-exposed hollowed high temperature durable bonding material is applied to the back side of the die-exposed hollowed integrated heat spreader (720) with good alignment. The high temperature durable bonding material (735) is composed of metal matrix composite (MMC) with features of quick/short process period, higher re-melting point, higher thermal conductivity and better contact interface with mating surfaces. In FIG. 10-3, STEP 703 exhibits that the integrated heat spreader (IHS, 720) is hermetically bonded with the backside metallization (no shown) of the silicon chip with the high temperature durable bonding material (735). The IHS Supporter (722) is sealed toward the PCB substrate (770) with the sealant (740). The above bonding process can be conducted in the same time or one after another. Finally, the phase change material (730-2) is applied into the cavity-like container (715-2) to cover the top surface of the backside metallization of the silicon die and the integrated heat spreader (HS, 720). In some case, the high thermal conductivity phase change material will have phase-change phenomenon (solid phase to liquid phase) as reach melting point. The cavity-like container (715-2) can confine phase change material and seal inside the cavity without any leakage. Then the heat Sink (710-2) with well-distributed fin array (713-2) is fixed to the HS supporter (714-2). The heat sink (710-2) with vents (712-2) can accommodate the expansion or shrinkage of phase change material (730-2) during thermal cycling. Normally the phase change material (PCM, 730-2) has very low thermal conductivity (such as paraffin wax has lower thermal conductivity about 0.2 W/MK). In order to improve the overall thermal conductivity between heat sink (HS, 710-2) and integrated heat spreader (IHS, 720), the high thermal conductivity particles (such as Cu particles, no shown) is mixed with the phase change material (PCM, 730-2), sometimes referred to as hybrid phase change material (hybrid PCM), and then this hybrid phase change material (hybrid PCM) is filled into the container (715-2) through vent (712-2) of the heat sink (710-2). The well-distributed fin array (713-2) of the heat sink (710-2) is also immersed with hybrid phase change material to enhance the overall thermal conductivity.

FIG. 7-2-1 is a schematic diagram illustrating the cross-section view of IHHDS (700-2) for the monolithic silicon die with the phase change material and fin array (hotspots-oriented distribution) embedded heat sink. As the hotspots located at silicon chip (750), hotspot-oriented distributed fin array (713-2) of heat sink (710-2) improves the heat transfer flux from the silicon die (750) effectively.

FIG. 7-3 is a schematic diagram illustrating the cross-section view of IHHDS (700-3) for monolithic silicon die with microjet impingement liquid cooling heat sink. A large silicon die (750) mounted on PCB substrate (770) by flip-chip solder balls (780) and infiltrated with underfill (760) between the gap of silicon die (750) and PCB substrate (770). Integrated Heat Spreader (IHS, 720) which consists of thin flexible IHS foil (721) and IHS supporter (722). IHS foil has a curve-shaped thermal-induced stress absorbing mechanism (723) on lateral ends and bond with IHS supporter (722) hermetically. In FIG. 10-1, STEP 701 exhibits the process to hermetically bond Heat Sink Supporter (714-3) and Integrated Heat Spreader (720) together. In FIG. 10-2, STEP 702 exhibits that apply die-exposed hollowed high temperature durable bonding material to the back side of die-exposed hollowed Integrated Heat Spreader (720) with good alignment. High temperature durable bonding material (735) is composed of metal matrix composite (MMC) with features of quick/short process period, higher re-melting point, higher thermal conductivity and better contact interface with mating surfaces. In FIG. 10-3, STEP 703 exhibits Integrated Heat Spreader (IHS, 720) is hermetically bonded with backside metallization (no shown) of silicon chip with high temperature durable bonding material (735). IHS Supporter (722) is sealed toward PCB substrate (770) with sealant (740). The above bonding process may be happen in the same time or one after another. Heat Sink (710-3) consists of complicated microjet impingement mechanism that cold liquid (730-3) is filled into inlet chamber (717-3) through inlet vent (711-3) and is direct-jetted on to the surface of silicon die (750) through jet nozzles (716-3). Heated liquid (730-3) is also filled into outlet queue chamber (719-3) through restored nozzles (718-3) and then pump out through outlet vents (712-3). Heat Sink (710-3) is attached to HS supporter (714-3) by O-ring other fixture mechanism (no shown) firmly without leakage.

FIG. 7-3-1 is a schematic diagram illustrating the top view A-A' of FIG. 7-3, the cross-section view of the IHHDS (700-3) for the monolithic silicon die with the microjet impingement liquid cooling heat sink. The schematic drawing also shows that the well-distributed cool liquid jet stream (726) is sprayed onto the surface of the silicon chip (750) and restored streams (727) toward outlet queue chamber (718-3).

Figures 2A, 8:
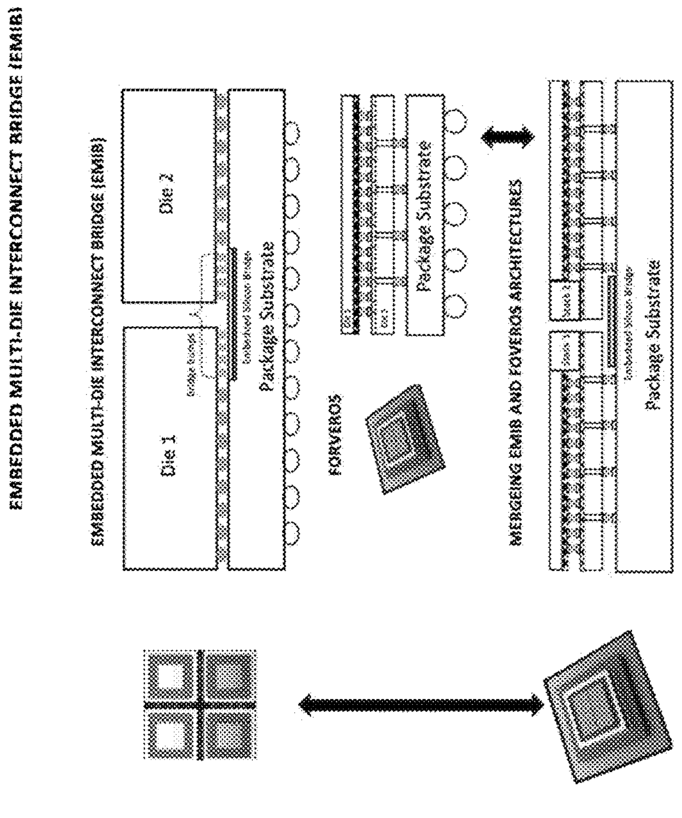

FIG. 7-3-2A, FIG. 7-3-2B and FIG. 7-3-2C are schematic diagrams illustrating the graphs from Ref. 7 and Ref. 8. FIG. 7-3-2A exhibits cross-section view of lidded cooling, and FIG. 7-3-2B exhibits cross-section view of direct cooling, both has micro-pins built on the surface of lid and silicon die separately. FIG. 7-3-2C exhibits microjet hotspot-targeted cooling and show distribution and direction of the jet nozzles onto the hotspots of silicon chip.

Figures 4, 6:
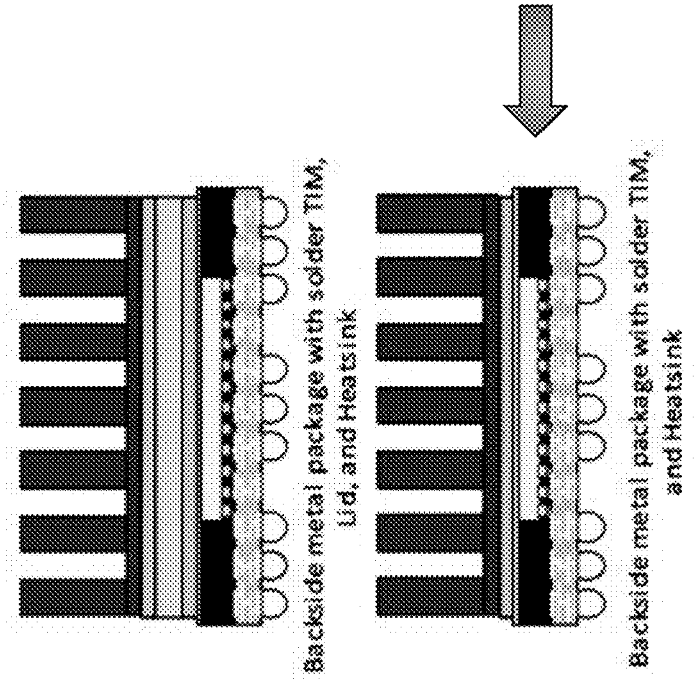
FIG.6-4 B (PRIOR ART)
Figures 4, 6:
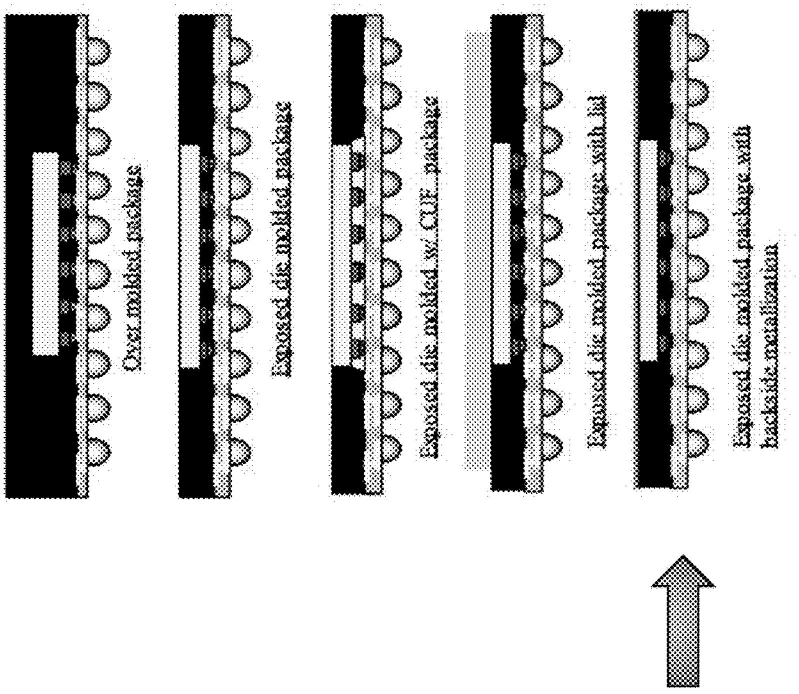
FIG.6-4 A (PRIOR ART)

FIG. 7-4 is a schematic diagram illustrating the graph from Ref. 5. The equilibrium phase change material temperature (PCM) curve illustrates the effect of a constant rate of heat flow into an otherwise thermally insulated volume of a PCM. The time history of this sample can be divided into three different stages. In the first and third stages, the phase change material (PCM) is entirely in a single phase: in the first stage, the material is 100% solid. In the third stage, it is 100% liquid. However, in stages 1 and 3, the temperature rises linearly under the influence of the constant rate of heat flow (so-called sensible heating period). Once the melting temperature, Twit, has been reached at the end of stage 1, the material begins to liquefy, and becomes 100% liquid at the end of stage 2. The temperature remains equal to $T_{Melt}$ throughout stage 2 (so-called latent heat storage period). During the second stage, the melting process absorbs heat from component and maintains component temperature still. In actual applications, the PCM is not thermally isolated, but, rather, it is configured to transfer heat to the ambient to extend the time before the PCM completely melts. Hence, the period time of second stage is related to specific heat of the phase change material and the temperature difference between $T_{Melt}$ and ambient temperature.

FIG. 7-5 is a schematic diagram illustrating the Temperature Profiles for uncoated and PCM coated copper heat spreaders, Samples 1-4. Conditions: 2.4 W constant power for 10 minutes. Ambient temperature=25° C. refer to FIG. 6 from Ref. 4. It shows the temperature profiles of the two copper heat spreader control samples and two PCM-coated samples. The more volume of PCM (thicker), the more heat can be absorbed and the peak temperature can be kept toward its melting point temperature longer.

FIG. 7-6, FIG. 7-7, and FIG. 7-8 are schematic diagrams illustrating: (a) Five different package configurations with increasing cooling integration from cases 1-5 and (b) comparison of the thermal responses of cases 1, 3, and 5 under forced convection cooling when subjected to 1 watt/$cm^2$ power pulses with duration of is (Ref. 6).

Figures 1, 11:
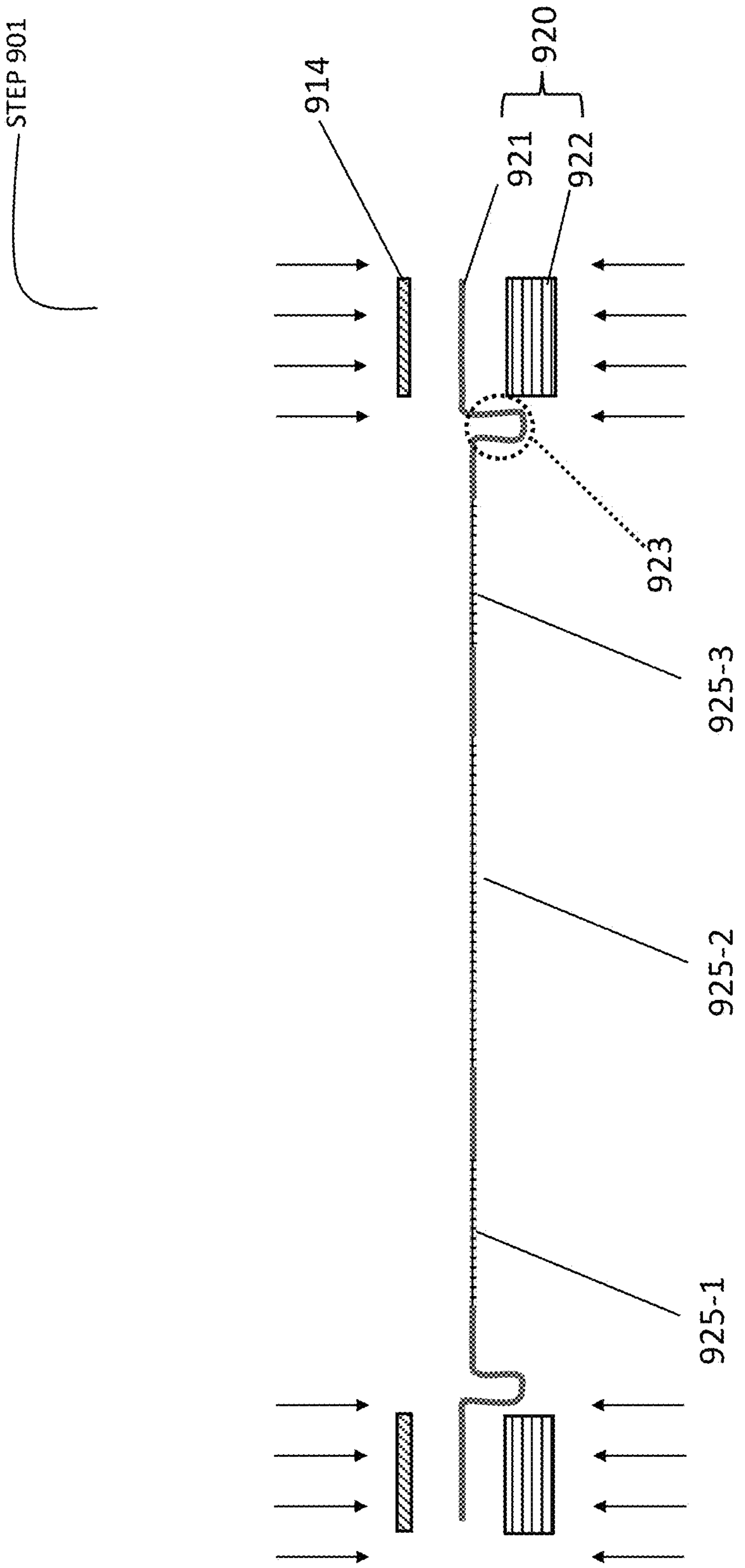
Figures 2, 11:
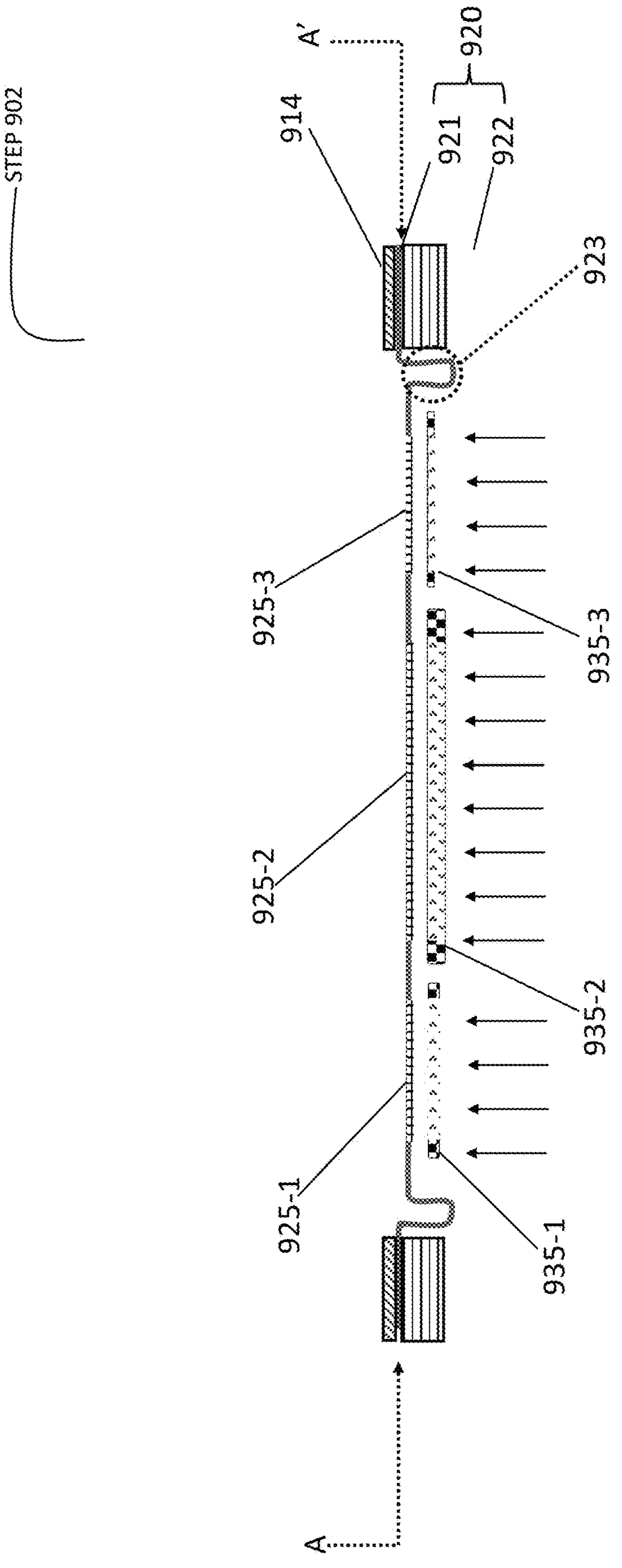
Figures 3, 11:
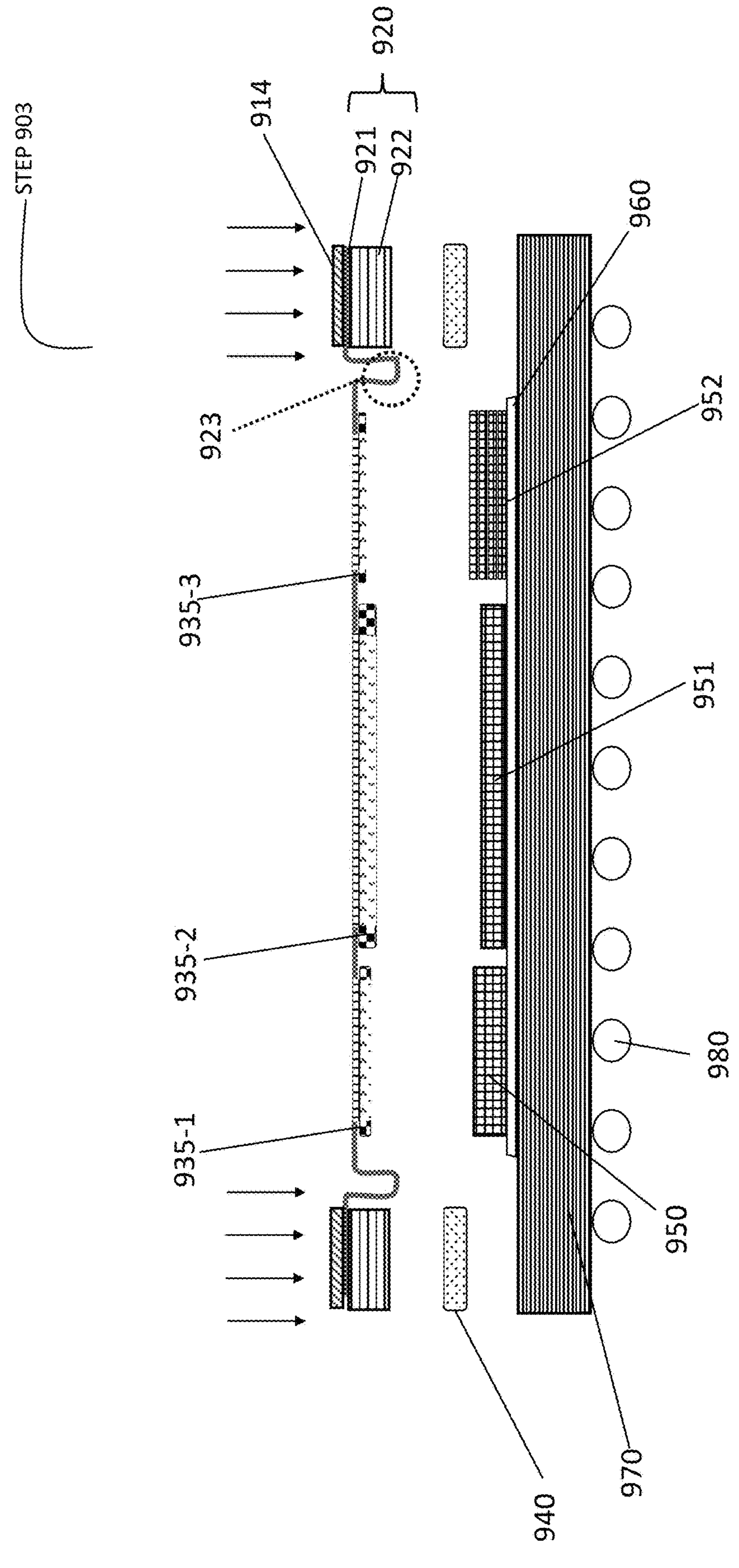
Figures 4, 11:
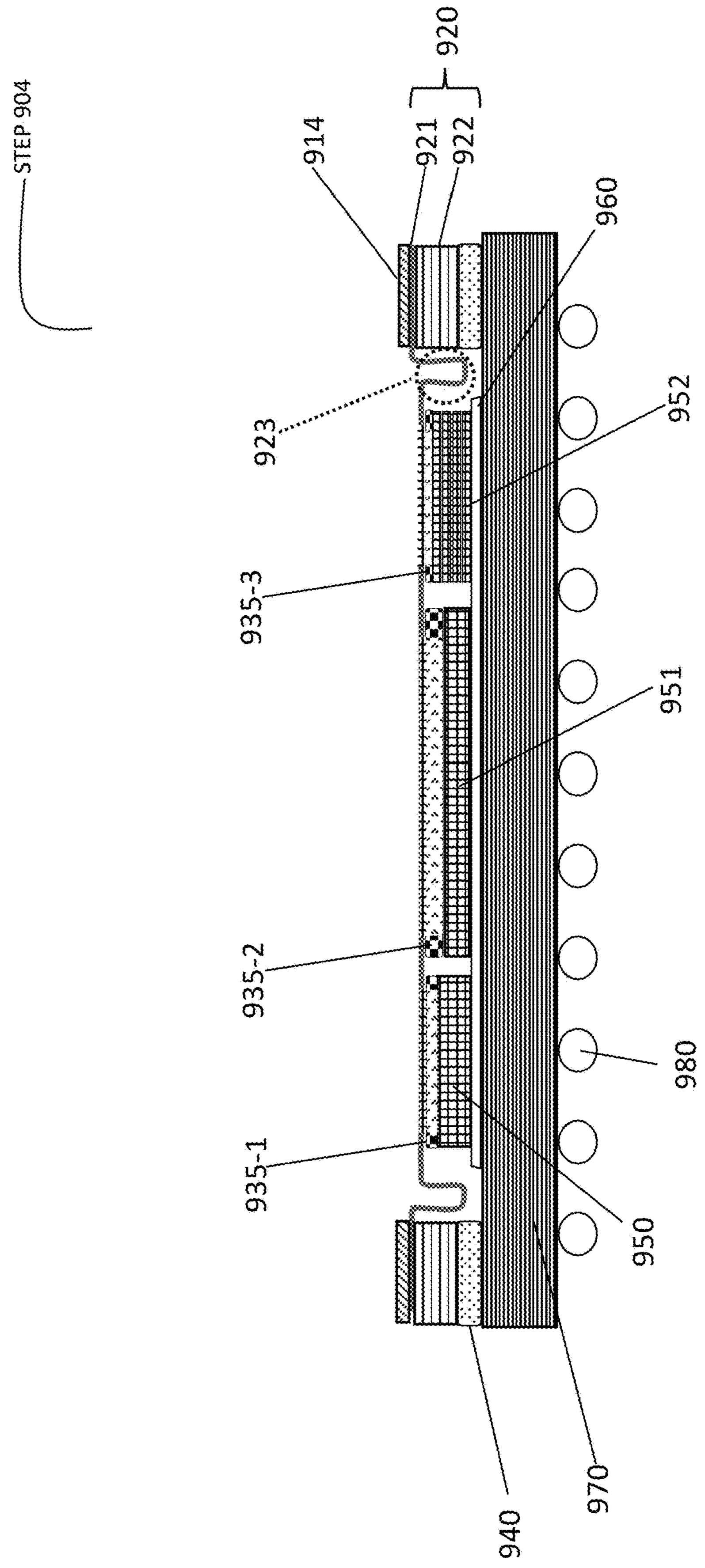

FIG. 9-1 is a schematic diagram illustrating the cross-section view of IHHDS (900) for chaplet heterogeneous integration. Multiple silicon dies which composed of tall chip (950), thin and flat chip (951), and stacked dies (952) mounted on PCB substrate (970) by flip-chip solder balls (no shown) and infiltrated with underfill (960) between the gap of multiple silicon die (950, 951, and 952) and PCB substrate (970). Integrated Heat Spreader (IHS, 920) which consists of thin flexible IHS foil (921) and IHS supporter (922). IHS foil has a curve-shaped thermal-induced stress absorbing mechanism (923) on lateral ends and bond with IHS supporter (922) hermetically. The thin flexible die-exposed IHS foil (921) is composed of high thermal conductivity material such as copper foil or other metal coated composite foil which made of graphite, graphene or carbon nanotube (CNT) inside. In FIG. 11-1, STEP 901 exhibits the process to hermetically bond Heat Sink Supporter (914) and Integrated Heat Spreader (920) together. In FIG. 11-2, STEP 902 exhibits that apply die-exposed hollowed high temperature durable bonding material (935) with different thickness to the back side of die-exposed hollowed Integrated Heat Spreader (920) with good alignment. High temperature durable bonding material (935) is composed of metal matrix composite (MMC) with quick/short process period, higher re-melting point, higher thermal conductivity and better contact interface with mating surfaces. In FIG. 11-3, STEP 903 exhibits Integrated Heat Spreader (920) is hermetically bonded with backside metallization (no shown) of silicon chip with high temperature durable bonding material (935). IHS Supporter (922) is sealed toward PCB substrate (970) with sealant (940). The above bonding process may be happen in the same time or one after another. Finally apply thermal interface material (TIM 1.5, 930) into the cavity-like container (915) and covered over the top surface of backside metallization of silicon die and Integrated Heat Spreader (920). In some case, high thermal conductivity thermal interface material such Indium or liquid metal composite with low modulus will become liquid-like phase as temperature go high and not easily fix on the surface of silicon die. The cavity-like container (915) can confine liquid-like thermal interface material and seal it inside the cavity without any leakage. Then fix and attach Heat Sink (910) to HS supporter (914). Heat Sink with vents (912) can accommodate the expansion or shrinkage of TIM 1.5 (930) during thermal cycling.

FIG. 9-1-1 is a schematic diagram illustrating the top view A-A' of FIG. 9-1, the cross-section view of IHHDS (900) for chaplet heterogeneous integration. Multiple silicon dies (950, 951, and 952) are located at the middle of thin flexible die-exposed IHS foil (921). Die-exposed area (924-1, 924-2, and 924-3) of thin flexible die-exposed IHS foil (721) are smaller than related area of silicon dies (950, 951, and 952) and edge-to-edge distance (d) is about 2-3 mm for the attachment area of high temperature durable bonding material (935). Thermal-induced stress absorbing mechanism (923) of thin flexible die-exposed IHS foil (921) is located laterally between multiple silicon dies (950, 951, and 952) and IHS supporter (914).

FIG. 9-1-2 is a schematic diagram illustrating the cross-section view of IHHDS (900) for chaplet heterogeneous integration with isolated grid bars on thin flexible IHS foil. Isolated supporter grids (938) which composed of heat isolated material with low thermal conductivity is attached onto flexible die-exposed IHS foil (921) in order to apply different TIM1.5 onto separated area for better overall thermal performance for each area and avoid the thermal cross-talk between neighboring silicon dies or area.

FIG. 9-1-3 is a schematic diagram illustrating the cross-section view of IHHDS (900) for chaplet heterogeneous integration with different protruded parts of het sink. Individual protruded parts (913-1, 913-2, and 913-3) of heat sink (710) shorten the distance with Individual silicon dies (950, 951, and 952) as less bonding line thickness (BLT) of thermal interface material (TIM 1.5, 930) as possible in order to reach best thermal performance for each silicon dies.

FIG. 9-2 is a schematic diagram illustrating the cross-section view of IHHDS (900-2) for chaplet heterogeneous integration with phase change material and uniform distributed fin array embedded heat sink. Multiple silicon dies (950, 951, and 952) mounted on PCB substrate (970) by flip-chip solder balls (no shown) and infiltrated with underfill (960) between the gap of silicon die (950) and PCB substrate (970). Integrated Heat Spreader (IHS, 920) which consists of thin flexible IHS foil (921) and IHS supporter (922). IHS foil has a curve-shaped thermal-induced stress absorbing mechanism (923) on lateral ends and bond with IHS supporter (922) hermetically. The thin flexible die-exposed IHS foil (921) is composed of high thermal conductivity material such as copper foil or other metal coated composite foil which made of graphite, graphene or carbon nanotube (CNT) inside. In FIG. 11-1, STEP 901 exhibits the process to hermetically bond Heat Sink Supporter (914) and Integrated Heat Spreader (920) together. In FIG. 11-2, STEP 902 exhibits that apply die-exposed hollowed high temperature durable bonding material (935) with different thickness to the back side of die-exposed hollowed Integrated Heat Spreader (920) with good alignment. High temperature durable bonding material (935) is composed of metal matrix composite (MMC) with features of quick/short process period, higher re-melting point, higher thermal conductivity and better contact interface with mating surfaces. In FIG. 11-3, STEP 903 exhibits Integrated Heat Spreader (IHS, 920) is hermetically bonded with backside metallization (no shown) of silicon chip with high temperature durable bonding material (935). IHS Supporter (922) is sealed toward PCB substrate (970) with sealant (940). The above bonding process may be happen in the same time or one after another. Finally apply Phase change material (935) into the cavity-like container (915-2) and covered over the top surface of backside metallization of silicon die and Integrated Heat Spreader (920). In some case, high thermal conductivity phase change material (930-2) will have phase-change phenomenon (solid phase to liquid phase) as reach melting point.

The cavity-like container (915-2) can confine phase change material (930-2) and seal inside the cavity without any leakage. Then fix Heat Sink (910-2) to HS supporter (914-2). Heat Sink (910-2) with vents (912-2) can accommodate the expansion or shrinkage of phase change material (930-2) during thermal cycling. Normally phase change material (PCM, 930-2) has very low thermal conductivity (such as paraffin wax has lower thermal conductivity about 0.2 W/MK). In order to improve the overall thermal conductivity between heat sink (HS, 910-2) and integrated heat spreader (IHS, 920), mixing high thermal conductivity particles (such as Cu particles, no shown) with phase change material (PCM, 930-2), sometimes referred to as hybrid phase change material (hybrid PCM), and then filling this hybrid phase change material (hybrid PCM) into the container (915-2) through vent (912-2) of heat sink (910-2). The well-distributed fin array (913-2) of heat sink (910-2) is also immersed with hybrid phase change material to enhance the overall thermal conductivity.

FIG. 9-2-1 is a schematic diagram illustrating the cross-section view of IHHDS (900-2) for chaplet heterogeneous integration with phase change material and fin array (hot-spots-oriented) embedded heat sink. As the hotspots located at silicon chips (950, 951, and 952), hotspot-oriented distributed fin array (913-2) of heat sink (910-2) improves the heat transfer flux from multiple silicon dies (950, 951, and 952) effectively.

FIG. 9-3 is a schematic diagram illustrating the cross-section view of IHHDS for chaplet heterogeneous integration with microjet impingement liquid cooling heat sink. Multiple silicon dies which composed of tall chip (950), thin and flat chip (951), and stacked dies (952) mounted on PCB substrate (970) by flip-chip solder balls (no shown) and infiltrated with underfill (960) between the gap of multiple silicon die (950, 951, and 952) and PCB substrate (970). Integrated Heat Spreader (IHS, 920) which consists of thin flexible IHS foil (921) and IHS supporter (922). IHS foil has a curve-shaped thermal-induced stress absorbing mechanism (923) on lateral ends and bond with IHS supporter (922) hermetically. The thin flexible die-exposed IHS foil (921) is composed of high thermal conductivity material such as copper foil or other metal coated composite foil which made of graphite, graphene or carbon nanotube (CNT) inside. In FIG. 11-1, STEP 901 exhibits the process to hermetically bond Heat Sink Supporter (914-3) and Integrated Heat Spreader (920) together. In FIG. 11-2, STEP 902 exhibits that apply die-exposed hollowed high temperature durable bonding material (935) with different thickness to the back side of die-exposed hollowed Integrated Heat Spreader (920) with good alignment. High temperature durable bonding material (935) is composed of metal matrix composite (MMC) with quick/short process period, higher re-melting point, higher thermal conductivity and better contact interface with mating surfaces. In FIG. 11-3, STEP 903 exhibits Integrated Heat Spreader (920) is hermetically bonded with backside metallization (no shown) of silicon chip with high temperature durable bonding material (935). IHS Supporter (922) is sealed toward PCB substrate (970) with sealant (940). The above bonding process may be happen in the same time or one after another. Heat Sink (910-3) consists of complicated microjet impingement mechanism that cold liquid (930-3) is filled into inlet chamber (917-3) through inlet vent (911-3) and is direct-jetted on to the surface of silicon dies (950, 951, and 952) through jet nozzles (916-3). Heated liquid (930-3) is also filled into outlet queue chamber (919-3) through restored nozzles (918-3) and then pump out through outlet vents (912-3). Heat Sink (910-3) is attached to HS supporter (914-3) by O-ring other fixture mechanism (no shown) firmly without leakage.

FIG. 9-3-1 is a schematic diagram illustrating the top view A-A' of FIG. 9-3, cross-section view of IHHDS for chaplet heterogeneous integration with microjet impingement liquid cooling heat sink. The schematic drawing also shows that well-distributed cool liquid jet stream (926) onto the surface of silicon chips (950) and restored streams (927) toward outlet queue chamber (918-3, no shown).

FIG. 10-1, FIG. 10-2, FIG. 10-3, and FIG. 10-4 are schematic diagrams illustrating the assembly process of thin flexible IHS foil attachment toward monolithic silicon chip package.

In FIG. 10-1, STEP 701 exhibits the process to hermetically bond Heat Sink Supporter (714) and Integrated Heat Spreader (720) together.

In FIG. 10-2, STEP 702 exhibits that the die-exposed hollowed high temperature durable bonding material is applied to the back side of die-exposed hollowed Integrated Heat Spreader (720) with good alignment. High temperature durable bonding material is composed of metal matrix composite (MMC) with quick/short process period, higher re-melting point, higher thermal conductivity and better contact interface with mating surfaces. Before this material attachment, the backside surface of Integrated Heat Spreader (720) may need surface treatment to keep the surface cleanness. Moreover, the pre-heating process may be also needed after this attachment to increase the contact surface stickiness.

In FIG. 10-3, STEP 703 exhibits Integrated Heat Spreader (720) is hermetically bonded with backside metallization (no shown) of silicon chip with high temperature durable bonding material (735). This quick bonding process (such as quick TCB or other solid-state thermosonic bonding) is relatively lower than the typical solder and the shorter bonding period can avoid the damage of silicon dies cause longer heating process. The application temperature of high temperature durable bonding material (735) which composed of metal matrix composite (MMC) is much higher than the melting point of the typical solder. IHS Supporter (722) is sealed toward PCB substrate (770) with sealant (740). The above bonding process can be conducted in the same time or one after another.

FIG. 11-1, FIG. 11-2, FIG. 11-3, and FIG. 11-4 are schematic diagrams illustrating the assembly process of thin flexible IHS foil attachment toward heterogeneous integration silicon chips package.

In FIG. 11-1, STEP 901 exhibits the process to hermetically bond Heat Sink Supporter (914) and Integrated Heat Spreader (920) together.

In FIG. 11-2, STEP 902 exhibits that the die-exposed hollowed high temperature durable bonding material (935) with different thickness is applied to the back side of die-exposed hollowed Integrated Heat Spreader (920) with good alignment. High temperature durable bonding material (935) is composed of metal matrix composite (MMC) with quick/short process period, higher re-melting point, higher thermal conductivity and better contact interface with mating surfaces. Before this material attachment, the backside surface of Integrated Heat Spreader (920) may need surface treatment to keep the surface cleanness. Moreover, the pre-heating process may be also needed after this attachment to increase the contact surface stickiness.

In FIG. 11-3, STEP 903 exhibits Integrated Heat Spreader (920) is hermetically bonded with backside metallization (no shown) of silicon chip with high temperature durable bonding material (935). This quick bonding process (such as quick TCB or other solid-state thermosonic bonding) is relatively lower than the typical solder and the shorter bonding period can avoid the damage of silicon dies cause longer heating process. The application temperature of high temperature durable bonding material (935) which composed of metal matrix composite (MMC) is much higher than the melting point of the typical solder. IHS Supporter (922) is sealed toward PCB substrate (970) with sealant (940). The above bonding process can be conducted in the same time or one after another.

It will become apparent to those people skilled in the art that various modifications and variations can be made to the structure of the disclosure without departing from the scope or spirit of the disclosure. In view of the foregoing description, it is intended that all the modifications and variation fall within the scope of the following appended claims and their equivalents.

What is claimed is:

1. A semiconductor package, comprising:

a silicon die mounted on a substrate by flip-chip solder balls;

an integrated heat spreader including a thin flexible foil and an integrated heat spreader supporter, wherein the thin flexible foil has a hollowed out central area and a curve-shaped thermal-induced stress absorbing mechanism, and the thin flexible foil is bonded with the silicon die with a high temperature durable bonding material, and a portion of the silicon die is exposed out through the hollowed out central area;

a heat sink with vents, wherein a cavity-like container portion is defined among the heat sink, the integrated heat spreader, and the exposed portion of the silicon die; and a thermal interface material applied within the cavity-like container portion, wherein heat generated from the silicon die is conducted directly through the thermal interface material to the heat sink, and the vents in the heat sink accommodates expansion or shrinkage of the thermal interface material during thermal cycling.

2. The semiconductor package as claimed in claim 1, wherein the high temperature durable bonding material includes metal matrix composite (MMC) of Cu-10Ni powders and SN100C powders, wherein the Cu-10Ni powders are sized at 25-32 μm, and the SN100C powders are sized at 5-15 μm.

3. The semiconductor package as claimed in claim 1, wherein the Cu-10Ni powders and the SN100C powders are composed from 60 volume percent Cu-10Ni with 40 volume percent SN100C to 90 volume percent Cu-10Ni with 10 volume percent SN100C.

4. The semiconductor package as claimed in claim 2, wherein the metal matrix composite has a quick/short process period less than 5 minutes and a re-melting point more than 300° C.

5. The semiconductor package as claimed in claim 1, wherein the backside of the heat sink includes a protruded part toward the silicon die.

6. The semiconductor package as claimed in claim 1, wherein the thermal interface material includes phase change material, and the heat sink includes a fin array immersed within the phase change material to enhance a thermal conductivity of the phase change material, wherein the phase change material absorb the absorbs heat from the silicon die and lowers a temperature of the silicon die.

7. The semiconductor package as claimed in claim 1, wherein the thin flexible foil of the integrated heat spreader is made of high thermal conductivity material such as copper foil or other metal coated composite foil which comprises graphite, graphene or carbon nanotube (CNT) inside.

8. A semiconductor package, comprising:

a silicon die mounted on a substrate by flip-chip solder balls;

an integrated heat spreader including a thin flexible foil and an integrated heat spreader supporter, wherein the thin flexible foil has a hollowed out central area and a curve-shaped thermal-induced stress absorbing mechanism, and the thin flexible foil is bonded with the silicon die with a high temperature durable bonding material, and a portion of the silicon die is exposed out through the hollowed out central area; and a heat sink including a microjet impingement mechanism, wherein the microjet impingement mechanism has an inlet chamber, a plurality of inlet vents, a plurality of jet nozzles, an outlet queue chamber, and a plurality of restored nozzles outlet vents;

wherein liquid is filled into the inlet chamber through the inlet vents and direct-jetted on the silicon die through the jet nozzles, and then liquid flows into the outlet queue chamber through the restored nozzles and exits through the outlet vents.

9. The semiconductor package as claimed in claim 8, wherein the high temperature durable bonding material includes metal matrix composite (MMC) of Cu-10Ni powders and SN100C powders, wherein the Cu-10Ni powders are sized at 25-32 μm, and the SN100C powders are sized at 5-15 μm.

10. The semiconductor package as claimed in claim 8, wherein the Cu-10Ni powders and the SN100C powders are composed from 60 volume percent Cu-10Ni with 40 volume percent SN100C to 90 volume percent Cu-10Ni with 10 volume percent SN100C.

11. The semiconductor package as claimed in claim 9, wherein the metal matrix composite has a quick/short process period less than 5 minutes and a re-melting point more than 300° C.

12. A semiconductor package, comprising:

at least a first die and a second die mounted on a substrate by flip-chip solder balls, wherein a first thickness of the first die is different from a second thickness of the second die;

an integrated heat spreader including a thin flexible foil and an integrated heat spreader supporter, wherein the thin flexible foil has at least two hollowed out central areas and a curve-shaped thermal-induced stress absorbing mechanism, and the thin flexible foil is bonded with the first die and the second die with a high temperature durable bonding material, and a portion of each first and second die is exposed out through the hollowed out central areas;

a heat sink fixed with vents, wherein a cavity-like container portion is defined among the backside of the heat sink, the integrated heat spreader, and the exposed portion of the first and second dies; and a thermal interface material applied within the cavity-like container portion, wherein heat generated from the first and second dies is conducted through the thermal interface material to the heat sink directly, and the vents in the heat sink accommodates expansion or shrinkage of the thermal interface material during thermal cycling;

wherein the high temperature durable bonding material applied between the integrated heat spreader and the first and second dies, and the heat sink comprises protruded parts with different thicknesses corresponding to the first thickness of the first die and the second thickness of the second die.

13. The semiconductor package as claimed in claim 12, further comprising isolated supporter grids made of heat isolating material with low thermal conductivity attached onto the integrated heat spreader in order to apply different thermal interface material onto different area of the first and second dies.

14. The semiconductor package as claimed in claim 12, wherein the high temperature durable bonding material includes metal matrix composite (MMC) of Cu-10Ni powders and SN100C powders, wherein the Cu-10Ni powders are sized at 25-32 μm, and the SN100C powders are sized at 5-15 μm.

15. The semiconductor package as claimed in claim 14, wherein the Cu-10Ni powders and the SN100C powders are composed from 60 volume percent Cu-10Ni with 40 volume percent SN100C to 90 volume percent Cu-10Ni with 10 volume percent SN100C.

16. The semiconductor package as claimed in claim 14, wherein the metal matrix composite has a quick/short process period less than 5 minutes and a re-melting point more than 300° C.

17. The semiconductor package as claimed in claim 12, wherein the backside of the heat sink includes protruded parts toward the corresponding first and second dies.

18. The semiconductor package as claimed in claim 12, wherein the thermal interface material includes phase change material, and the backside of the heat sink includes a fin array immersed within the phase change material to enhance thermal conductivity of the phase change material.

19. A semiconductor package, comprising:

at least a first die and a second die mounted on a substrate by flip-chip solder balls, wherein a first thickness of the first die is different from a second thickness of the second die;

an integrated heat spreader including a thin flexible foil and an integrated heat spreader supporter, wherein the thin flexible foil has at least two hollowed out central areas and a curve-shaped thermal-induced stress absorbing mechanism, and the thin flexible foil is bonded with the first die and the second die with a high temperature durable bonding material, and a portion of each first and second die is exposed out through the hollowed out central areas of the integrated heat spreader; and a heat sink including a microjet impingement mechanism, wherein the microjet impingement mechanism has an inlet chamber, a plurality of inlet vents, a plurality of jet nozzles, an outlet queue chamber, and a plurality of restored nozzles outlet vents;

wherein liquid is filled into the inlet chamber through the inlet vents and direct-jetted on each of first and second dies through the jet nozzles, and liquid then flows into the outlet queue chamber through the restored nozzles and exits through the outlet vents.

20. The semiconductor package as claimed in claim 19, wherein the high temperature durable bonding material includes metal matrix composite (MMC) of Cu-10Ni powders and SN100C powders, wherein the Cu-10Ni powders are sized at 25-32 μm, and the SN100C powders are sized at 5-15 μm, and the Cu-10Ni powders and the SN100C powders are composed from 60 volume percent Cu-10Ni with 40 volume percent SN100C to 90 volume percent Cu-10Ni with 10 volume percent SN100C.

* * * * *